(12) United States Patent
Maeda et al.

(10) Patent No.: US 10,553,805 B2
(45) Date of Patent: Feb. 4, 2020

(54) ORGANIC EL DISPLAY PANEL AND MANUFACTURING METHOD OF ORGANIC EL DISPLAY PANEL

(71) Applicant: JOLED INC., Tokyo (JP)

(72) Inventors: Noriteru Maeda, Tokyo (JP); Kenichi Nendai, Tokyo (JP)

(73) Assignee: JOLED INC., Tokyo (JP)

( * ) Notice: Subject to any disclaimer, the term of this patent is extended or adjusted under 35 U.S.C. 154(b) by 43 days.

(21) Appl. No.: 16/003,187

(22) Filed: Jun. 8, 2018

(65) Prior Publication Data

US 2018/0358573 A1 Dec. 13, 2018

(30) Foreign Application Priority Data

Jun. 9, 2017 (JP) .................. 2017-113905

(51) Int. Cl.
*H01L 51/50* (2006.01)
*H01L 51/52* (2006.01)
*H01L 27/32* (2006.01)
*H01L 51/56* (2006.01)
*H01L 51/00* (2006.01)
(Continued)

(52) U.S. Cl.
CPC ....... *H01L 51/5036* (2013.01); *G09G 3/3208* (2013.01); *H01L 27/1214* (2013.01); *H01L 27/322* (2013.01); *H01L 27/3246* (2013.01); *H01L 27/3262* (2013.01); *H01L 51/0005* (2013.01); *H01L 51/0008* (2013.01); *H01L 51/0096* (2013.01); *H01L 51/5056* (2013.01); *H01L 51/5072* (2013.01); *H01L 51/5088* (2013.01); *H01L 51/524* (2013.01); *H01L 51/5212* (2013.01); *H01L 51/5218* (2013.01); *H01L 51/5221* (2013.01);
(Continued)

(58) Field of Classification Search
CPC ............. H01L 51/5036; H01L 51/5044; H01L 27/1214; H01L 27/322
See application file for complete search history.

(56) References Cited

U.S. PATENT DOCUMENTS

2005/0093850 A1 5/2005 Mori et al.
2015/0044805 A1 2/2015 Ishino et al.
(Continued)

FOREIGN PATENT DOCUMENTS

JP 2004-335180 A 11/2004
JP 3928417 B2 6/2007
(Continued)

*Primary Examiner* — Marc Anthony Armand
(74) *Attorney, Agent, or Firm* — Hauptman Ham, LLP

(57) ABSTRACT

An organic EL display panel with improved visibility is disclosed which includes sub-pixels each emitting light of a color selected from R, G, and B and disposed in a matrix, pixel electrodes disposed above a substrate in the matrix corresponding to the sub-pixels, and column banks row-directionally arranged extending in the column direction. The organic EL display panel further includes pairs of auxiliary column banks extending parallel to the main column banks, disposed in gaps between pairs of the column banks adjacent to each other where the pixel electrodes corresponding to the sub-pixels emitting the B color are present, each pair of the auxiliary column banks covering both edges in the row direction of each of the pixel electrodes therebetween.

6 Claims, 21 Drawing Sheets

(51) Int. Cl.
  *H01L 27/12*      (2006.01)
  *G09G 3/3208*    (2016.01)

(52) U.S. Cl.
  CPC ........ *H01L 51/56* (2013.01); *G02F 2201/121* (2013.01); *G02F 2201/123* (2013.01); *H01L 2251/5315* (2013.01)

(56) References Cited

U.S. PATENT DOCUMENTS

2017/0117339 A1    4/2017  Takata
2017/0287993 A1*  10/2017  Takata ................ H01L 27/3211
2019/0157625 A1*   5/2019  Nakayama .............. H01L 51/56

FOREIGN PATENT DOCUMENTS

| | | |
|---|---|---|
| JP | 2009-259457 A | 11/2009 |
| WO | 03/075255 A1 | 9/2003 |
| WO | 2014/030354 A1 | 2/2014 |
| WO | 2015/155971 A1 | 10/2015 |

* cited by examiner

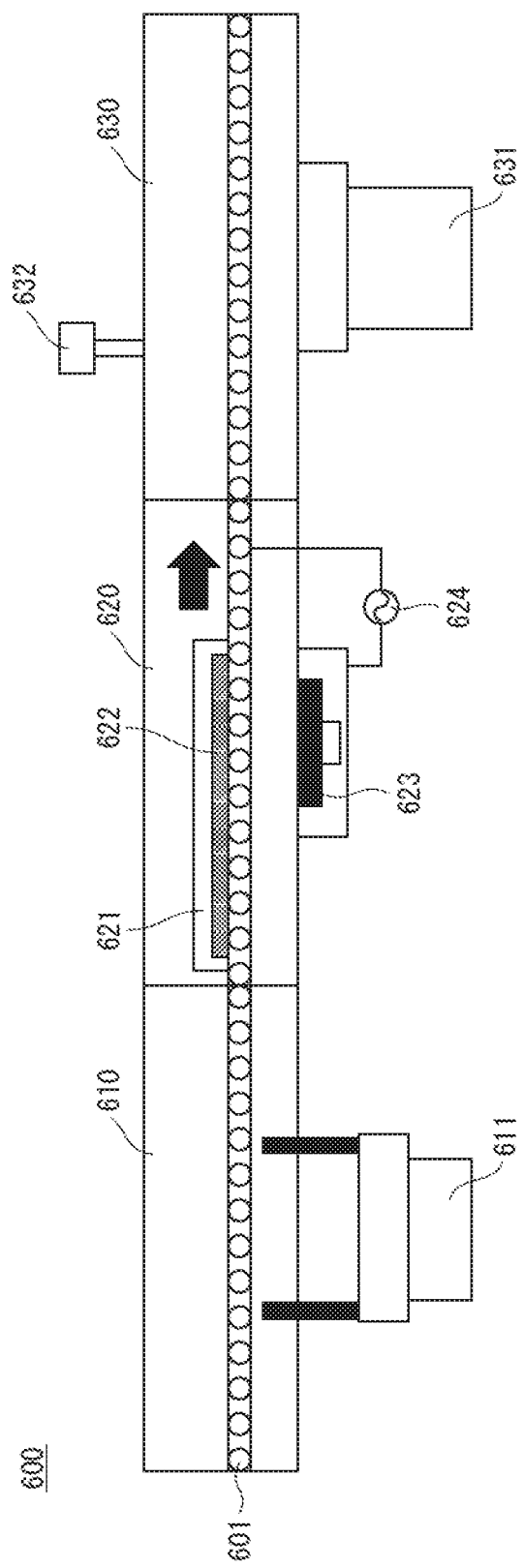

Column bank height: 1 μm

Column bank height: 0.5 μm

ORGANIC EL DISPLAY PANEL AND MANUFACTURING METHOD OF ORGANIC EL DISPLAY PANEL

This application claims priority to Japanese Patent Application No. 2017-113905 filed Jun. 9, 2017, the contents of which are hereby incorporated by reference in their entirety.

BACKGROUND

Technical Field

The present disclosure relates to organic electro luminescence (EL) display panels that use organic EL elements that make use of electro luminescence of organic materials and to methods of manufacturing the organic EL display panels.

Description of Related Art

Recently, organic EL display panels with organic EL elements arranged in a matrix on a substrate are being applied as display panels in display devices such as digital televisions.

The organic EL elements have light emitting layers including an organic light emitting material between pairs of electrodes. In such an organic EL display panel, the light emitting layers of an organic EL element and an adjacent organic EL element are partitioned by an insulating layer including an insulating material. When driven, a voltage is applied to the pairs of electrodes and the organic EL elements emit light due to recombination of holes and electrons injected in the light emitting layers.

When manufacturing organic EL display panels including such organic EL elements, particularly when manufacturing main parts such as the light emitting layers, banks are formed to surround areas for applying liquid ink, and the liquid ink inside the areas surrounded by the banks (hereafter, openings) is discharged using, for example, a droplet discharge method typified by an inkjet method. By discharging liquid ink using such a method, mixing of the applied liquid ink with the liquid ink in adjacent areas is suppressed, enabling light emitting layers to be in a fine detailed pattern.

According to Japanese patent application publication No. 2009-259457, provided that banks have circular openings and liquid ink is discharged into the openings, when the banks are relatively high, light emitting films are concaved in the central portion with thickness increasing toward the banks. Alternatively, when the banks are relatively low, the light emitting films are convexed in the center. Hence, each of the openings are formed in an oval or an elliptic shape with a long and a short axis, with the height of a first bank portion along the short axis direction of the openings formed higher than that of a second bank portion along the long axis direction. By discharging liquid ink into the openings formed as such, the light emitting films can be planarly shaped.

SUMMARY

An organic EL display panel pertaining to at least one embodiment of the present disclosure is an organic EL display panel having sub-pixels each emitting light of a color selected from a defined number of emitted colors and disposed in a matrix. The organic EL display panel includes a substrate. The organic EL display panel further includes pixel electrodes disposed above the substrate in the matrix, corresponding to the sub-pixels, and including a light reflective material. The organic EL display panel further includes main column banks extending in a column direction, each of the main column banks disposed at least between a pair of the pixel electrodes adjacent to each other in a row direction. The organic EL display panel further includes pairs of auxiliary column banks extending parallel to the main column banks and disposed in gaps between pairs of the main column banks adjacent to each other, where the pixel electrodes corresponding to the sub-pixels emitting light of a defined color selected from the emitted colors are present, each pair of the auxiliary column banks covering both edges in the row direction of each of the pixel electrodes therebetween. The organic EL display panel further includes light emitting layers disposed in the gaps and including an organic light emitting material. The organic EL display panel further includes a common electrode layer extending continuously above the main column banks, the auxiliary column banks, and the light emitting layers, the common electrode layer including a light transmitting material, in which a height of the auxiliary column banks from a surface of the substrate is lower than a height of the main column banks from the surface of the substrate.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 15 is a schematic diagram of a structure of sputtering device 600 used in manufacturing common electrode layer 125 according to at least one embodiment.

DETAILED DESCRIPTION

1 Background Leading to Embodiment of Present Disclosure

Japanese patent application publication No. 2009-259457 recites that since the height of a second bank portion is lower than that of a first bank portion, a problem occurs whereby liquid ink flows over the second bank portion and mixes colors with liquid ink of adjacent pixels when liquid ink is applied to a substrate.

In order to resolve the issues above, researchers of the present disclosure have gained the following findings and knowledge from accumulated research results.

(1) Change Over Time of Viewing Angle Characteristics of Luminances

Figure 16A:
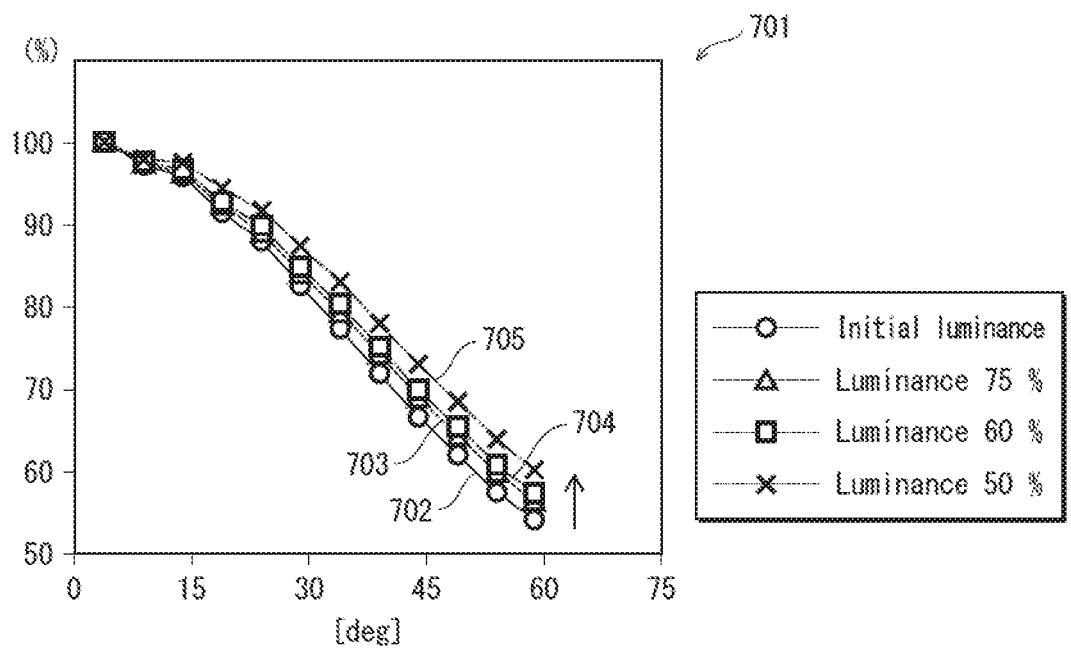
FIG. 16A is a graph of change over time of viewing angle characteristics of luminance of organic EL elements according to at least one embodiment.
Figure 16B:
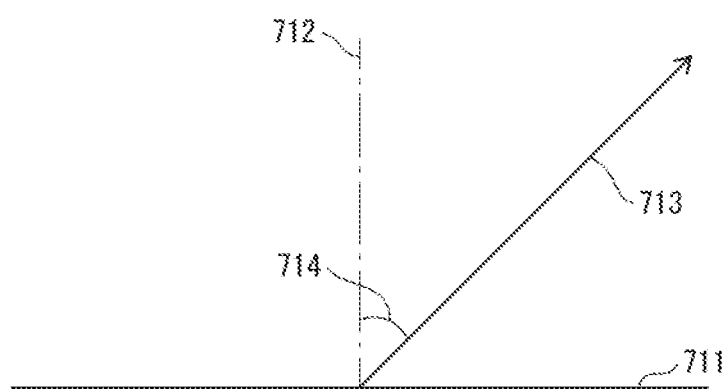
FIG. 16B is a diagram illustrating the relationship of a light emitting surface and a viewing angle according to at least one embodiment.

FIG. 16A is a graph of change over time of viewing angle characteristics of the luminances of organic EL elements according to at least one embodiment, and FIG. 16B is the relationship between a light emitting surface and viewing angles according to at least one embodiment. Researchers of the present disclosure found that after a long-term light emission of the organic EL elements, the luminances of the organic EL elements in a diagonal direction 713 with respect to a light emitting direction (front direction) 712 perpendicular to a light emitting surface 711 of the organic EL elements in FIG. 16B vary from the luminances of the organic EL elements at an initial state of light emission. In FIG. 16B, a viewing angle is a degree 714 formed between the light emitting direction 712 and the diagonal direction 713.

FIG. 16A is the experimental result of change of luminances actually measured at each viewing angle during long and continual light emission of the organic EL elements.

A horizontal axis of graph 701 in FIG. 16A is the degree 714 in FIG. 16B, between the diagonal direction 713 and the light emitting direction 712. A vertical axis of the graph in FIG. 16B is a ratio of the luminance of emitted light at each angle in relation to the luminance in the light emitting direction 712.

A curved line 702 in graph 701 plots a ratio of luminance in relation to the initial luminance at the initial state of emission of the organic EL elements at each angle. Curved lines 703, 704 and 705 in graph 701 plot a ratio of luminance at each angle when an average luminance at the front direction decreases to 75%, 67% and 50% of the initial luminance, respectively.

In graph 701, the luminance of emitted light in the diagonal direction 713 in FIG. 16B changes over time in relation to the luminance at an initial state of emission. The viewing angle characteristics of the luminance of the organic EL elements change over time as described above.

(2) Change Over Time of Luminance Distribution in Sub-Pixels

Figure 17:
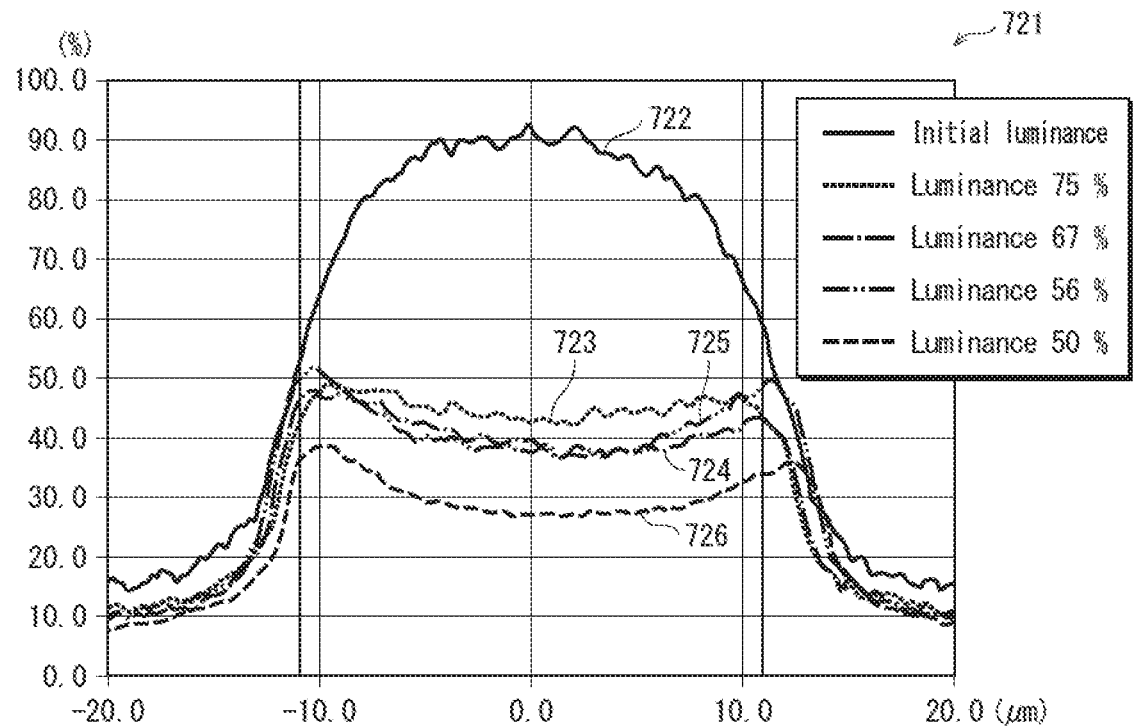
FIG. 17 is a graph of change over time of luminance distribution in sub-pixels according to at least one embodiment.

FIG. 17 is a graph of change over time of luminance distribution in sub-pixels, measured during long and continual light emission of the organic EL elements, according to at least one embodiment.

In graph 721 of FIG. 17, a horizontal axis indicates a position along the light emitting surface in each organic EL element, whereby an origin (marked "0" on the horizontal axis) is the center point of the light emitting surface of each organic EL element. A vertical axis indicates the ratio (%) of luminance of emitted light in relation to the initial luminance at an initial state of emission.

Curve 722 indicates a ratio distribution of a luminance at an initial state of emission. Curves 723, 724, 725 and 726 plot a ratio of luminance distribution when an average luminance at the front direction decreases to 75%, 67%, 56% and 50% of the initial luminance, respectively.

In graph 721, luminance deteriorates over time and the luminance distribution in the pixels of the organic EL elements is non-uniform within the same degree of deterioration. The central parts of the sub-pixels deteriorate first, followed by the edge parts of the sub-pixels.

Figure 18:
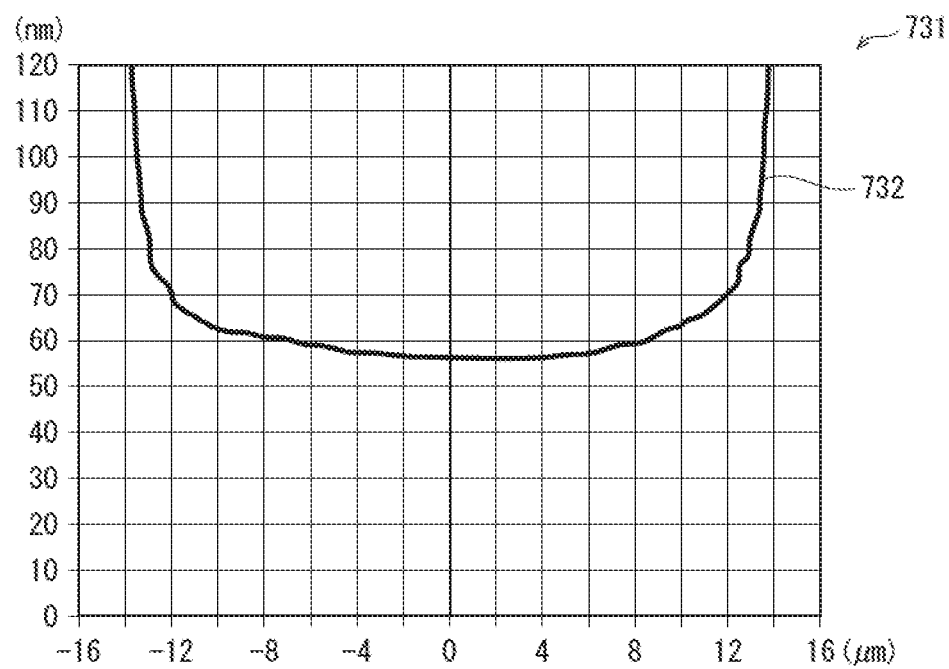
FIG. 18 is a graph of a shape of printed films of light emitting layers according to at least one embodiment.

FIG. 18 is a graph of an actual measurement of a shape of printed films of the light emitting layers and the like according to at least one embodiment. Curve 732 plots the shape of surfaces of the printed films of the light emitting layers in the organic EL elements. In FIG. 18, the planarity of the surfaces of the printed films in the sub-pixels of the organic EL elements is low.

The researchers of the present disclosure presumed that non-uniformity of the luminance distribution in the sub-pixels of the organic EL elements and the low planarity of the shapes of the printed films of the light emitting layers in the organic EL elements are associated with each other. In the printed films of the light emitting layers of the organic EL elements, luminance of thin parts (center) of the printed films deteriorate before thick parts (edge) of the printed films. Thus, as deterioration progresses, luminance is dominated by light emission from the thick parts (edge) rather than the thin parts (center).

The present disclosure includes the organic EL display panel and the organic EL display panel manufacturing method capable of minimizing the occurrence of display defects by improving planarity of the shape of the film surfaces of the light emitting layers of the organic EL elements while reducing or eliminating mixing of liquid ink between adjacent pixels.

2 Overview of Embodiments

An organic EL display panel pertaining to at least one embodiment of the present disclosure is an organic EL display panel having sub-pixels each emitting light of a color selected from a defined number of emitted colors and disposed in a matrix. The organic EL display panel includes a substrate. The organic EL display panel further includes pixel electrodes disposed above the substrate in the matrix, corresponding to the sub-pixels, and including a light reflective material. The organic EL display panel further includes main column banks extending in a column direction, each of the main column banks disposed at least between a pair of the pixel electrodes adjacent to each other in a row direction. The organic EL display panel further includes pairs of auxiliary column banks extending parallel to the main column banks and disposed in gaps between pairs of the main column banks adjacent to each other, where the pixel electrodes corresponding to the sub-pixels emitting light of a defined color selected from the emitted colors are present, each pair of the auxiliary column banks covering both edges in the row direction of each of the pixel electrodes therebetween. The organic EL display panel further includes light emitting layers disposed in the gaps and including an organic light emitting material. The organic EL display panel further includes a common electrode layer extending continuously above the main column banks, the auxiliary column banks, and the light emitting layers, the common electrode layer including a light transmitting material, in which a height of the auxiliary column banks from a surface of the substrate is lower than a height of the main column banks from the surface of the substrate.

According to at least one embodiment, a distance between the pair of the auxiliary column banks adjacent to each other is equal to or greater than half of a distance between the pair of the main column banks adjacent to each other sandwiching the pair of the auxiliary column banks.

According to at least one embodiment, the defined color is blue.

According to at least one embodiment, light emitting layers disposed in gaps between pairs of the main column banks adjacent to each other not sandwiching the pairs of the auxiliary column banks, and including organic light emitting materials of light emitting colors other than the defined color, in which a distance between the pairs of the main column banks adjacent to each other sandwiching the pairs of the auxiliary column banks is greater than a distance between the pairs of the main column banks adjacent to each other sandwiching the pixel electrodes corresponding to the sub-pixels emitting light of the color other than the defined color.

According to at least one embodiment, the organic EL display panel further includes hole injection layers disposed above the pixel electrodes, in which the light emitting layers are disposed above the hole injection layers, and the height of the auxiliary column banks from the surface of the substrate is greater than a total film thickness of the light emitting layers and the hole injection layers, and is less than twice the total film thickness of the light emitting layers and the hole injection layers.

The method of manufacturing an organic EL display panel pertaining to at least one embodiment is a method of manufacturing an organic EL display panel having sub-pixels each emitting light of a color selected from a defined number of emitted colors and disposed in a matrix. The method includes preparing a substrate. The method further includes disposing pixel electrodes above the substrate in the matrix, corresponding to the sub-pixels, and including a light reflective material. The method further includes forming main column banks extending in a column direction, each of the main column banks disposed at least between a pair of the pixel electrodes adjacent to each other in a row direction. The method further includes forming pairs of auxiliary column banks with each pair of the auxiliary column banks extending parallel to the main column banks and disposed in gaps between a pair of the main column banks adjacent to each other where the pixel electrodes corresponding to the sub-pixels emitting light of a defined color selected from the emitted colors are present, forming the pairs of the auxiliary column banks covering both edges in the row direction of each of the pixel electrodes therebetween, forming a height of the auxiliary column banks from a surface of the substrate to be lower than a height of the main column banks from the surface of the substrate. The method further includes disposing light emitting layers including an organic light emitting material in the gaps. The method further includes disposing a common electrode layer including a light transmitting material, the common electrode layer extending continuously above the main column banks, the auxiliary column banks, and the light emitting layers.

According to at least one embodiment, by setting the height of the auxiliary column banks lower than the height of the main column banks, the planarity of the film shapes of the light emitting layers between each pair of the auxiliary column banks is increased compared to the planarity of the film shapes of the light emitting layers between each pair of the main column banks not sandwiching a pair of the auxiliary column banks. In addition, when the pairs of the main column banks sandwiching a pair of the auxiliary column banks are higher than the auxiliary column banks, mixing of liquid ink between adjacent sub-pixels is suppressed. Thus, an occurrence of display defects can be reduced.

3 Embodiments

1 Overall Configuration
3.1 Circuit Configuration of Organic EL Display Device 1

Figure 1:
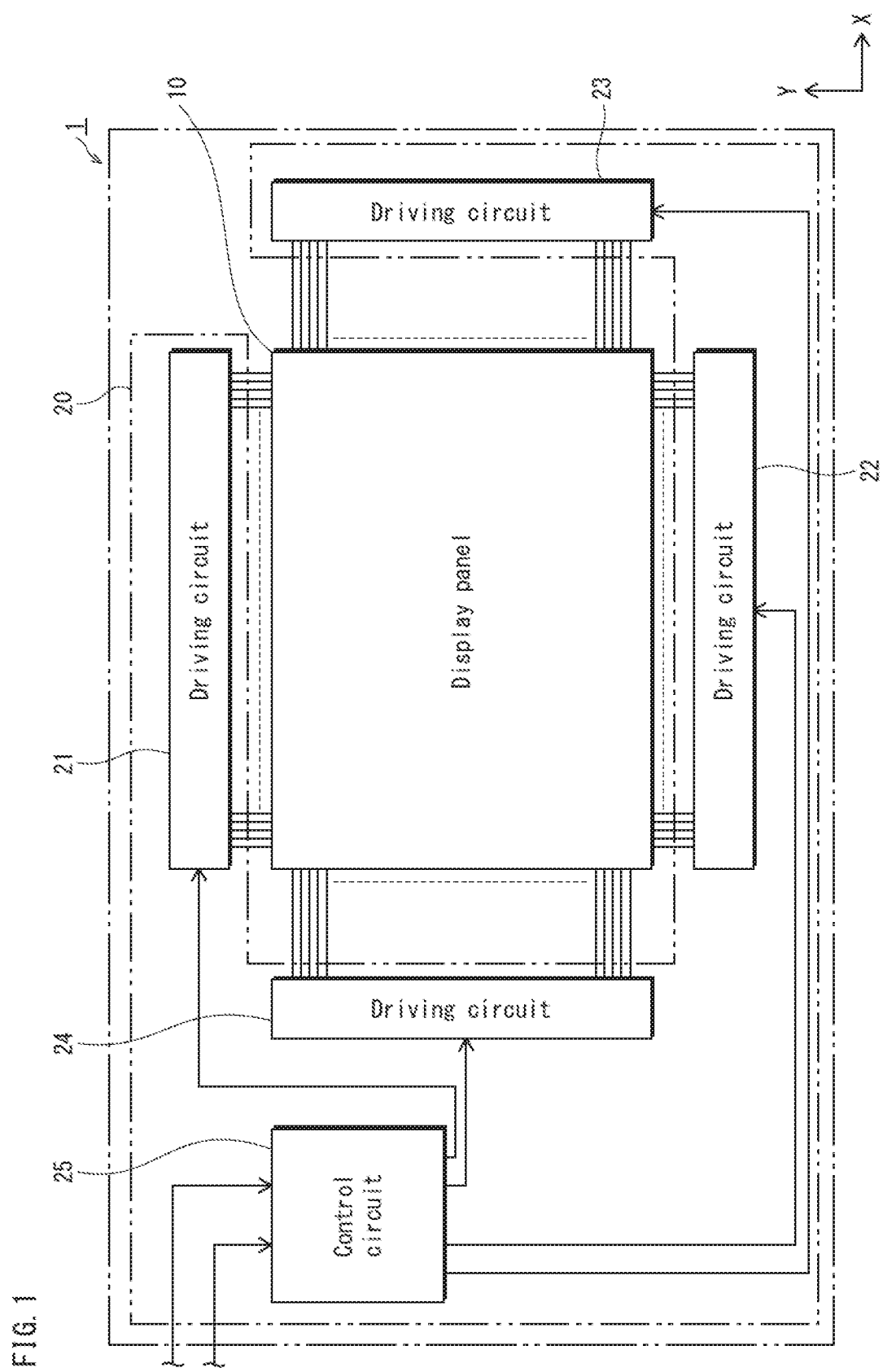
FIG. 1 is a block diagram of a circuit configuration of organic EL display device 1 according to at least one embodiment.

A circuit configuration of an organic EL display device 1 according to at least one embodiment of the present disclosure is as follows. FIG. 1 is a block diagram of the circuit configuration of the organic EL display device 1 according to at least one embodiment.

In FIG. 1, the organic EL display device 1 includes the organic EL display panel 10 and the driving control circuit 20 connected to the organic EL display panel 10.

The organic EL display panel 10 is a display panel that makes use of electroluminescence of organic materials, including organic EL elements arranged, for example, in a matrix. The driving control circuit 20 corresponds to 4 driving circuits, namely driving circuits 21 to 24, and a control circuit 25.

The arrangement of each circuit of the driving control circuit 20 in relation to the organic EL display panel 10 of the organic EL display device 1 is not limited to the arrangement in FIG. 1.

3.2 Circuit Configuration of Organic EL Display Panel 10

Figure 2:
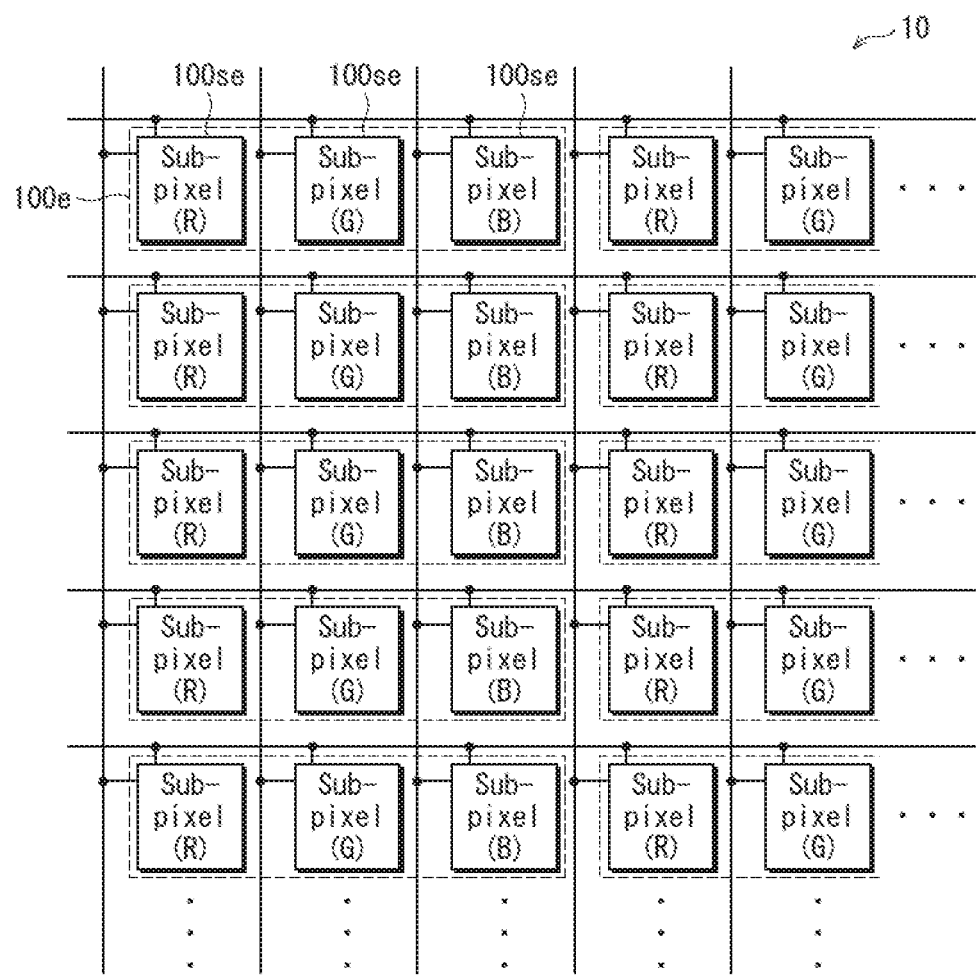
FIG. 2 is a layout drawing of a plurality of sub-pixels in organic EL display panel 10 according to at least one embodiment.

FIG. 2 is a circuit diagram of the arrangement of the sub-pixels in the organic EL display panel 10 according to at least one embodiment. In FIG. 2, in the organic EL display panel 10, unit pixels 100e are arranged in a matrix to constitute a display area. Each unit pixel 100e includes three organic EL elements, namely three sub-pixels 100se emitting red (R), green (G), and blue (B) lights, respectively. The areas having the sub-pixels so arranged are referred to as pixel areas.

A circuit configuration of each sub-pixel 100se is described with reference to FIG. 3.

Figure 3:
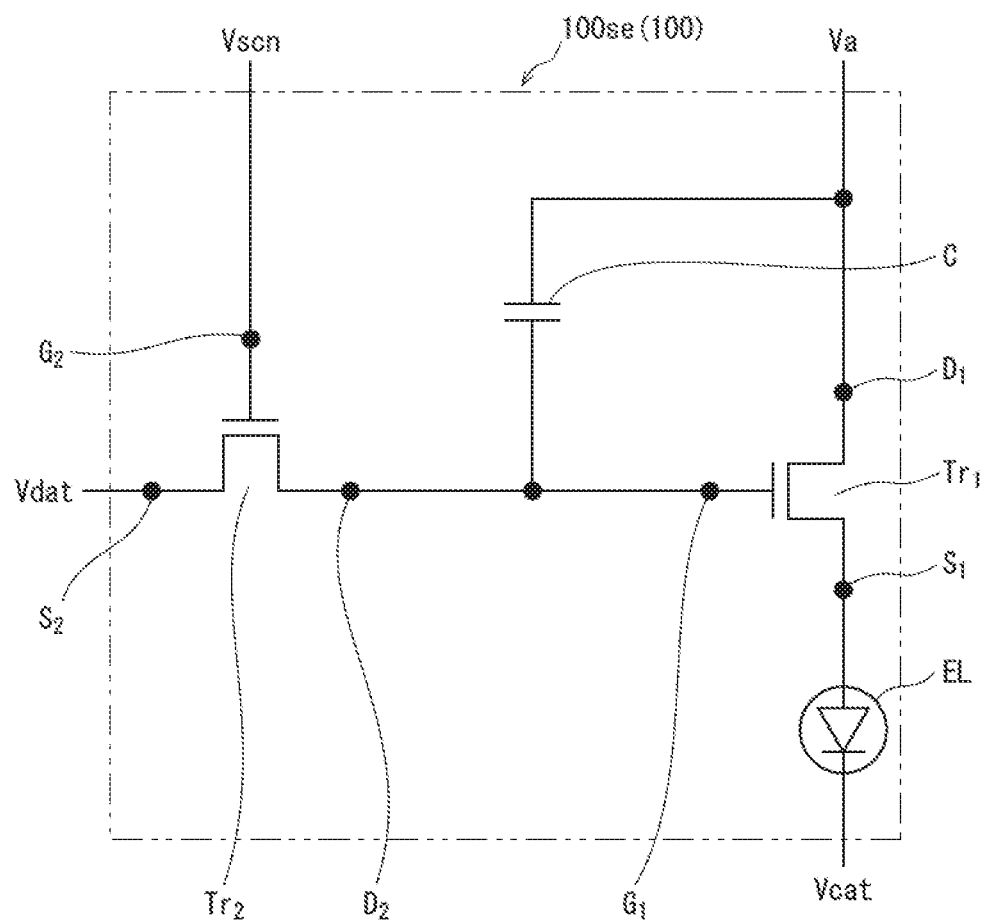
FIG. 3 is a circuit diagram of each sub-pixel 100*se* in organic EL display panel 10 according to at least one embodiment.

FIG. 3 is a circuit diagram indicating the circuit configuration of the organic EL elements 100 corresponding to each sub-pixel 100se of the organic EL display panel 10 according to at least one embodiment.

In FIG. 3, each sub-pixel 100se of the organic EL display panel 10 according to the present embodiment includes two transistors $Tr_1$ and $Tr_2$, a capacitor C, and an organic EL element portion EL which emits light. The transistor $Tr_1$ is a drive transistor, and the transistor $Tr_2$ is a switching transistor.

A gate $G_2$ of the switching transistor $Tr_2$ is connected to a scanning line Vscn, and a source $S_2$ is connected to a data line Vdat. A drain $D_2$ of the switching transistor $Tr_2$ is connected to a gate $G_1$ of the drive transistor $Tr_1$.

A drain $D_1$ of the drive transistor $Tr_1$ is connected to a power supply line Va, and a source $S_1$ is connected to a pixel electrode (anode) of the organic EL element portion EL. A common electrode layer (cathode) of the organic EL element portion EL is connected to a grounding line Vcat.

A first end of the capacitor C is connected to the drain $D_2$ of the switching transistor $Tr_2$ and the gate $G_1$ of the drive transistor $Tr_1$, and a second end of the capacitor C is connected to the power supply line Va.

A gate line is drawn out from the gate $G_2$ of each sub-pixel 100se and is connected to the scanning line Vscn which connects from outside of the organic EL display panel 10. Similarly, a source line is drawn out from the source $S_2$ of each sub-pixel 100se and is connected to the data line Vdat which connects from outside of the organic EL display panel 10.

The power supply line Va of each sub-pixel 100se and the grounding line Vcat of each sub-pixel 100se are aggregated and connected to the power supply line and the grounding line of the organic EL display device 1, respectively.

3.3 Overall Structure of Organic EL Display Panel 10

An organic EL display panel 10 pertaining to the present embodiment is described with reference to the drawings. The drawings are schematic diagrams and are not necessarily to scale.

Figure 4:
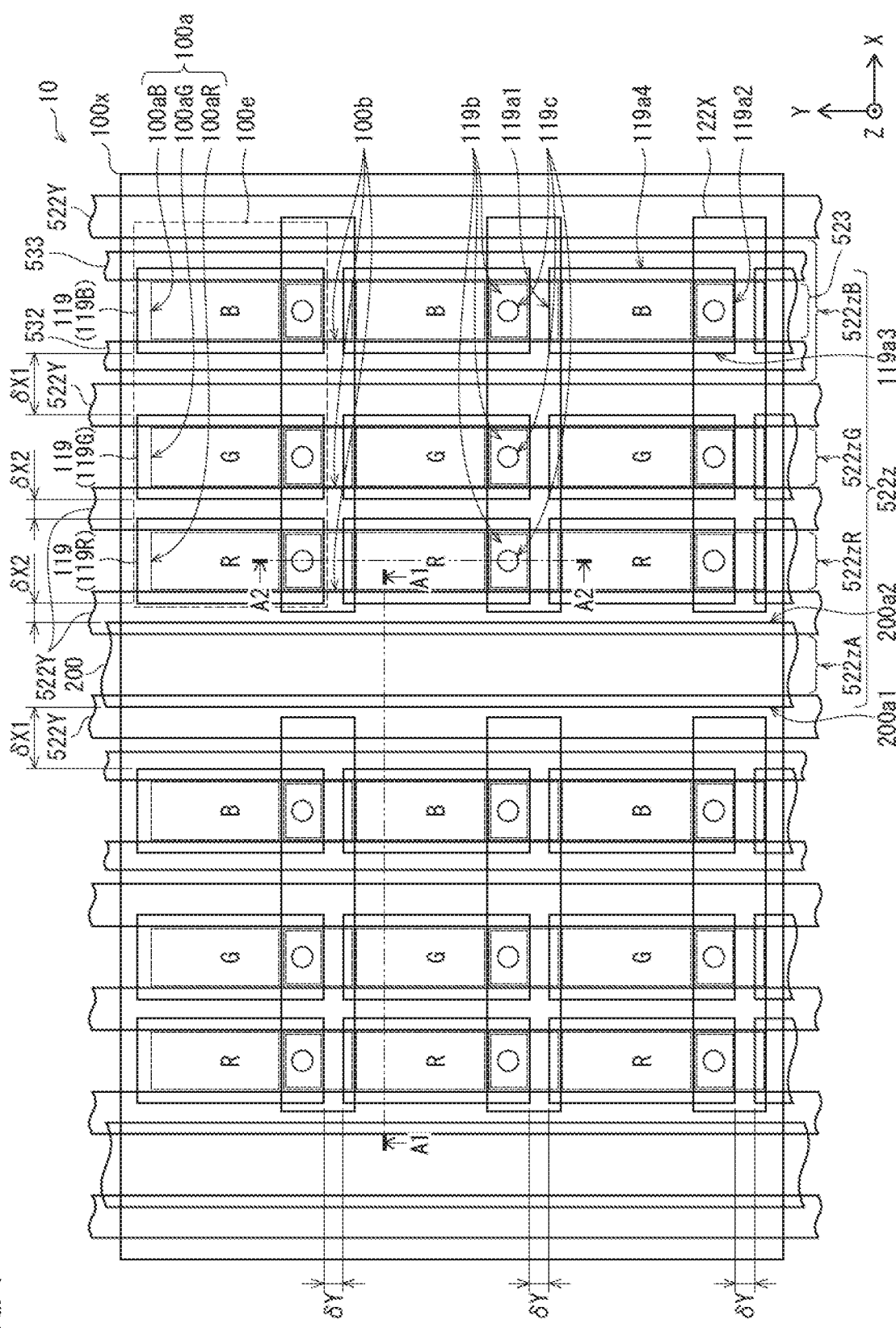
FIG. 4 is a schematic plan view of a part of organic EL display panel 10 according to at least one embodiment.

FIG. 4 is a schematic plan view of a part of the organic EL display panel 10 pertaining to at least one embodiment.

The organic EL display panel 10 is a display panel that makes use of electroluminescence of organic compounds, and has the organic EL elements 100 arranged in a matrix on a substrate (TFT substrate) 100x on which thin film transistors (TFTs) are formed, whereby the organic EL elements 100 have a top emission type configuration emitting light from an upper surface. Here, in the present disclosure, an X direction, Y direction, and Z direction in FIG. 4 correspond to a row direction, column direction, and thickness direction of the organic EL display panel 10, respectively.

The display area of the organic EL display panel 10 has unit pixels 100e arranged in a matrix with each of the unit pixels 100e including three organic EL elements 100. Each unit pixel 100e has three self light emitting regions 100a that emit light by using organic compounds, namely, a self light emitting region 100aR emitting red light, a self light emitting region 100aG emitting green light, and a self light emitting region 100aB emitting blue light (hereinafter referred to as "self light emitting regions 100a" where self light emitting regions 100aR, 100aG, and 100aB are not distinguished). The self light emitting regions 100aR, 100aG, and 100aB are arranged in a row direction, and the three sub-pixels 100se (hereinafter referred to as a "blue sub-pixel 100seB", a "green sub-pixel 100seG" and a "red sub-pixel 100seR" where distinction is made by color) corresponding to the respective self light emitting regions make one set to constitute unit pixels 100e in a color display.

The organic EL display panel 10 has the pixel electrodes 119 arranged in a matrix of columns and rows above the substrate 100x. The organic EL display panel 10 has an auxiliary electrode layer 200 above the substrate 100x, wherein the auxiliary electrode layer 200 is disposed extending continuously in the column direction between unit pixels 100e adjacent to each other in the row direction. Another auxiliary electrode layer 200 is disposed extending continuously in the column direction between unit pixels 100e adjacent to each other in the row direction. Thus, each auxiliary electrode layer 200 is disposed extending continuously in the column direction between pairs of the unit pixels 100e adjacent to each other in the row direction. Consequently, the organic EL display panel 10 has a plurality of the auxiliary electrode layers 200 disposed extending continuously in the column direction.

Between pixel electrodes 119 and adjacent pixel electrodes 119 in the row direction are column banks 522Y or column banks 522Y and auxiliary column banks 532 extending in a line shape in the column direction. Between pixel electrodes 119 and adjacent auxiliary electrode layers 200 in the row direction are column banks 522Y or column banks 522Y and auxiliary column banks 533 extending in the column direction.

Between pixel electrodes 119 and adjacent pixel electrodes 119 in the column direction are row banks 122X extending in a line shape in the row direction.

Thus, the column banks 522Y, the auxiliary column banks 532 and 533 in pairs, and the row banks 122X are above the substrate 100x.

Figure 5:
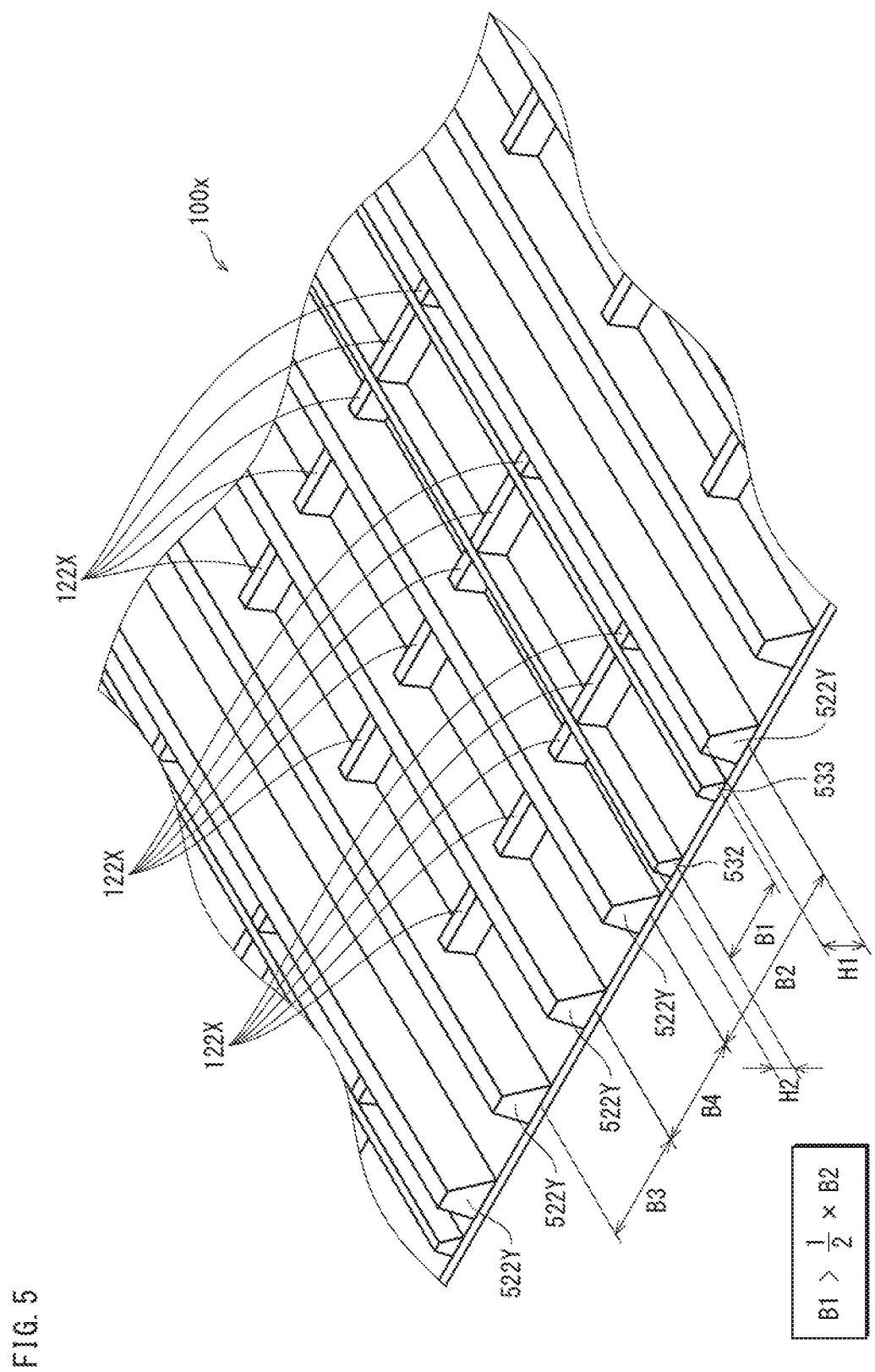
FIG. 5 is a perspective view of substrate 100*x* with column banks 522Y, auxiliary column banks 532, 533, and row banks 122X being above the substrate according to at least one embodiment.

FIG. 5 is a perspective view of the substrate 100x with the column banks 522Y, the auxiliary column banks 532 and 533 in pairs, and the row banks 122X above the substrate 100x according to at least one embodiment.

In FIG. 5, the column banks 522Y and the pairs of the auxiliary column banks 532 and 533 are lined up in the row direction, and the row banks 122X are lined up in the column direction, with the banks 522Y, 532, 533 and 122X disposed above the substrate 100x. The column banks 522Y and the pairs of the auxiliary column banks 532 and 533 are disposed orthogonal to the row banks 122X.

3.4 Specific Configuration of Organic EL Display Panel 10

Figure 6:
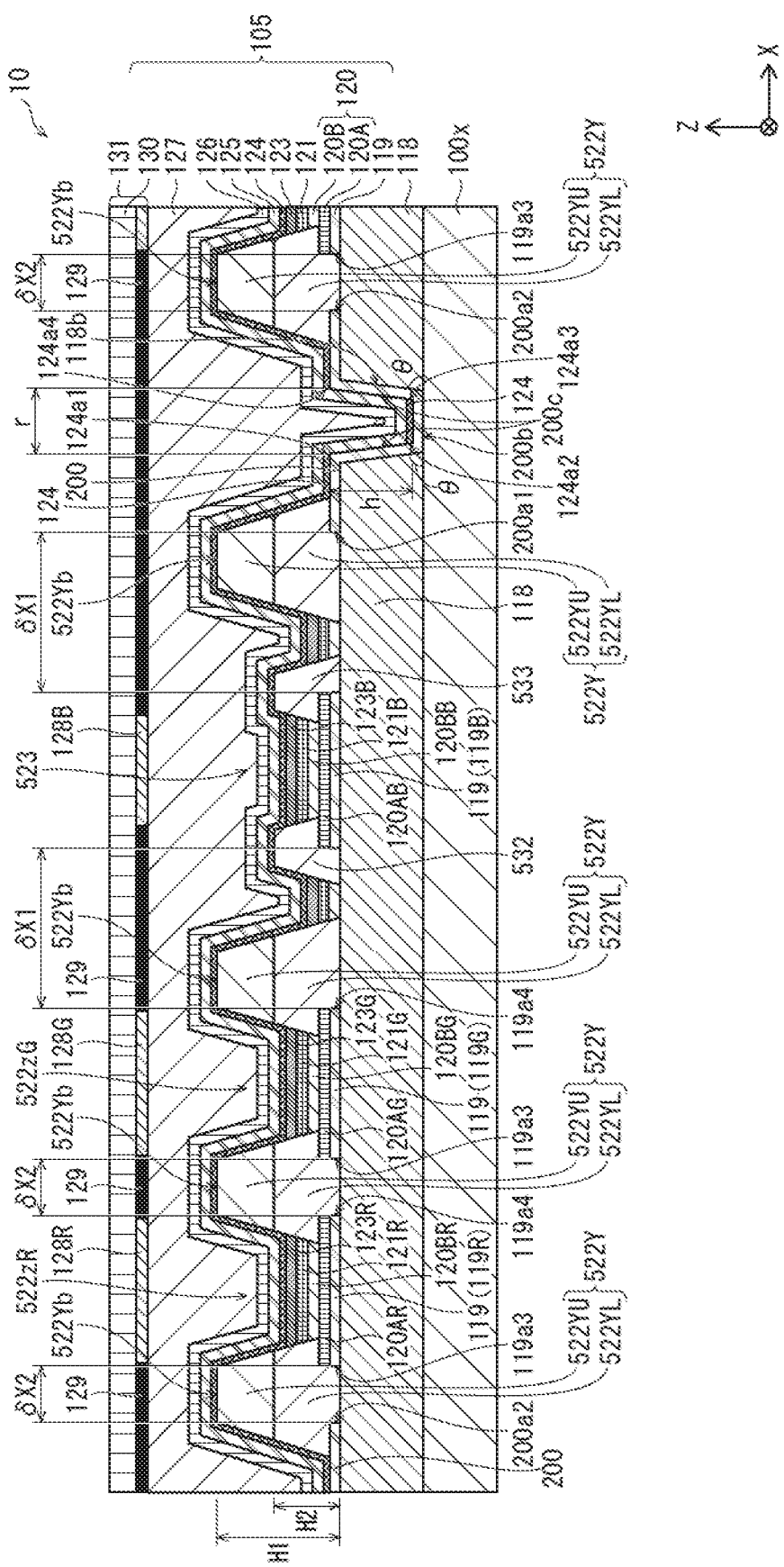
FIG. 6 is a cross-sectional view taken from the arrow direction of the A1-A1 line in FIG. 4 according to at least one embodiment.
Figure 7:
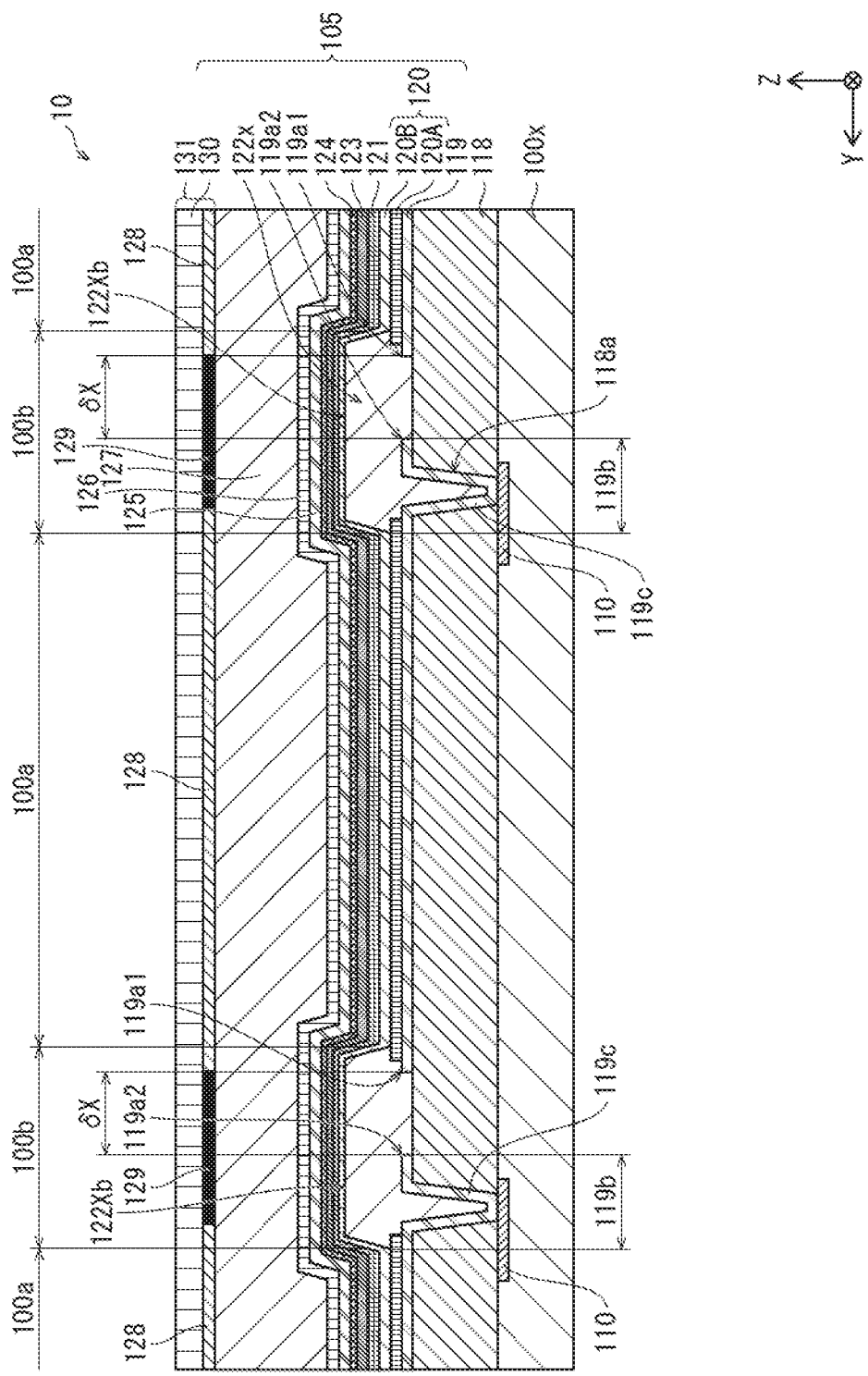
FIG. 7 is a cross-sectional view taken from the arrow direction of the A2-A2 line in FIG. 4 according to at least one embodiment.

A configuration of the organic EL elements 100 in the organic EL display panel 10 is described with reference to the schematic cross sections of FIG. 6 and FIG. 7. FIG. 6 is a cross-sectional view taken from the arrow direction of the A1-A1 line in FIG. 4 according to at least one embodiment. FIG. 7 is a cross-sectional view taken from the arrow direction of the A2-A2 line in FIG. 4 according to at least one embodiment.

The organic EL display panel 10 pertaining to the present embodiment includes the substrate (TFT substrate) 100x which has a thin film transistor formed thereon and is disposed at a lowest position along a Z-axis, an interlayer insulating layer 118, and an organic EL layer 105 which is above the interlayer insulating layer 118.

3.4.1 Substrate 100x and Interlayer Insulating Layer 118

(1) Substrate 100x

The substrate 100x is provided with a base material (not illustrated) and a thin film transistor layer (not illustrated) on the base material.

The base material is a support member of the organic EL display panel 10 and has a flat plate shape. An electrically insulating material can be used as a material of the base, such as a glass material, a resin material, a semiconductor material, or a metal material coated with an insulating layer.

The TFT layer is provided with TFTs and wires including wires 110 (FIG. 7) formed on an upper surface of the base. The TFTs electrically connect corresponding pixel electrode layers 119 to an external power source according to drive signals from an external circuit of the organic EL display panel 10, and have a multilayer structure including electrodes, semiconductor layers, and insulating layers. The wires electrically connect the TFTs, the pixel electrodes 119, the external power source, the external circuit, and the like. The wires 110 are connected to TFT sources S1 (FIG. 3).

(2) Interlayer Insulating Layer 118

The interlayer insulating layer 118 is on the surface of the TFT layer and the base material. The interlayer insulating layer 118 disposed on the upper surface of the substrate 100x planarizes the upper surface of the substrate 100x made uneven by the overlaid TFT layer. Further, the interlayer insulating layer 118 fills spaces between the wires and the TFTs to electrically insulate between the wires and the TFTs.

In FIG. 6, contact holes 118b are in the interlayer insulating layer 118, and in FIG. 7, contact holes 118a are above portions of the wires 110.

When film thickness of the interlayer insulating layer 118 is 10 μm or more, variation in the film thickness and difficulty of bottom line width control increase in terms of manufacturing. A desirable film thickness of the interlayer insulating layer 118 is 7 μm or less, so as to suppress productivity reduction due to takt time increase. As the film thickness of the interlayer insulating layer 118 is made thinner, the film thickness and the bottom line width are made equivalent, but when the film thickness of the interlayer insulating layer 118 is 1 μm or less, a desired bottom line width is difficult to obtain due to resolution restrictions. A lower limit of the film thickness of the interlayer insulating layer 118 is 2 μm when used in an exposure device for a general flat panel display. Therefore, the interlayer insulating layer 118 beneficially has the film thickness, for example, from 1 μm to 10 μm. Further, the interlayer insulating layer 118 more beneficially has the film thickness from 2 μm to 7 μm.

3.4.2 Organic EL Layer 105

(1) Pixel Electrodes 119

In FIG. 6 and FIG. 7, the pixel electrodes 119 in units of sub-pixels 100se are on the interlayer insulating layer 118 disposed on the upper surface of the substrate 100x. In other words, the pixel electrodes 119 are disposed above the interlayer insulating layer 118 in column and row directions, arranged in a matrix with each of the pixel electrodes 119 apart from each other by a defined distance (FIGS. 4, 6 and 7). The pixel electrodes 119 supply carriers to light emitting layers 123. For example, when the pixel electrodes 119 function as anodes, they supply holes to the light emitting layers 123. Moreover, as the organic EL display panel 10 is a top emission type, the pixel electrodes 119 are made by using light reflective materials to reflect light. The pixel electrodes 119 are, for example, in a flat rectangular plate shape in a plan view.

Three pixel electrodes 119 aligned in the row direction correspond to three respective self light emitting regions 100aR, 100aG, and 100aB aligned in the row direction. Here, the pixel electrodes 119 corresponding to the three self light emitting regions 100aR, 100aG, and 100aB are referred to as pixel electrodes 119R, 119G and 119B, respectively, when distinction is made by color.

Regions having the pixel electrodes 119 disposed therein are defined by edges 119a3 and edges 119a4 in the row direction, and by edges 119a1 and edges 119a2 in the column direction (FIG. 4).

Pixel electrodes 119R and pixel electrodes 119G adjacent to each other in the row direction are disposed apart from each other by a defined distance of δX2. Similarly, pixel electrodes 119G and pixel electrodes 119B adjacent to each other in the row direction are disposed apart from each other by a defined distance of δX1. Moreover, the pixel electrodes 119B and the auxiliary electrode layers 200 adjacent to each other in the row direction are disposed above the interlayer insulating layer 118 apart from each other by a defined distance of δX1. Here, δX1>δX2.

Moreover, in FIG. 4, in each gap 522zR, 522zG, and 522zB, the pixel electrodes 119 adjacent to each other in the column direction are apart from each other by a defined distance of δY, and are disposed above the interlayer insulating layer 118.

In FIG. 7, connecting recesses 119c of the pixel electrodes 119 which are a part of the pixel electrodes 119 recessed in the thickness direction of the substrates 100x are above the contact holes 118a of the interlayer insulating layer 118, wherein the pixel electrodes 119 and the wires 110 connect at the bottom of the connecting recesses 119c.

(2) Auxiliary Electrode Layers 200

In FIG. 6, the auxiliary electrode layers 200 are disposed above the interlayer insulating layer 118 on the upper surface of the substrate 100x, extending continuously in the column direction between the unit pixels 100e.

The auxiliary electrode layers 200 are formed by using the same light reflecting material as that of the pixel electrodes 119. The auxiliary electrode layers 200 have connecting recesses 200b which connect the auxiliary electrode layers 200 and a common electrode layer 125 described later in the present description.

Edges 200a1 and 200a2 in the row direction (FIG. 4) define areas where auxiliary electrode layers 200 are disposed.

The auxiliary electrode layers 200 and the pixel electrodes 119R adjacent to each other in the row direction are disposed separated by a defined distance δx2. The auxiliary electrode layers 200 and the pixel electrodes 119B adjacent to each other in the row direction are disposed separated by a defined distance δx1.

Connecting recesses 200b which are parts of the auxiliary electrode layers 200 recessed in the thickness direction of the substrate 100x are disposed along the contact holes 118b of the interlayer insulating layer 118 (FIG. 6). Contact surfaces 200c are an interior wall inside the connecting recesses 200b. The connecting recesses 200b have a substantially circular shape when viewed from above, and beneficially have a diameter r in the range from 2 μm to 10 μm. The connecting recesses 200b beneficially have a depth h in the range from 1 μm to 7 μm. The contact surfaces 200c beneficially have an inclination angle θ in the range from 75 degrees to 120 degrees with respect to the upper surface of the substrate 100 x.

(3) Hole Injection Layers 120

In FIGS. 6 and 7, the hole injection layers 120 are layered on the pixel electrodes 119. The hole injection layers 120 transport holes injected from the pixel electrodes 119 to hole transport layers 121.

The hole injection layers 120 include lower layers 120A formed by using a metal oxide and layered on the pixel electrodes 119, and upper layers 120B formed by using an organic substance and layered at least on the lower layers 120A, layered in this order above the substrate 100x. The lower layers 120A in blue, green and red sub-pixels are labelled as lower layers 120AB, 120AG, and 120AR respectively. The upper layers 120B in blue, green and red sub-pixels are labelled as upper layers 120BB, 120BG and 120BR respectively.

According to the present embodiment, the upper layers 120B are in a linear shape and extend in the column direction within gaps 522zR, 522zG and 522zB which are described later. However, the upper layers 120B may be on only the lower layers 120A above the pixel electrodes 119, being discontinuous in the column direction in the gaps 522z.

(4) Banks 122

(Overview)

In FIGS. 6 and 7, banks (barrier walls) cover the edges of the pixel electrodes 119, the lower layers 120A of the hole injection layers 120 and the auxiliary electrode layers 200. The banks, in FIGS. 4 and 5, are provided with the column banks 522Y and the auxiliary column banks 532 and 533, which extend in the column direction and are lined up in the row direction, and the row banks 122X which extend in the row direction and are lined up in the column direction. The column banks 522Y and the auxiliary column banks 532 and 533 are orthogonal to the row banks 122X. The column banks 522Y and the auxiliary column banks 532 and 533 create a lattice shape with the row banks 122X. Hereinafter, the row banks 122X, the auxiliary column banks 532 and 533, and the column banks 522Y are referred to as "banks 122" when no distinction is made between them.

The self light emitting regions 100a are between row banks 122X adjacent to each other in the column direction, between column banks 522Y adjacent to each other in the row direction, and between auxiliary column banks 532 and 533 adjacent to each other. Thus, the row banks 122X and the column banks 522Y, and the row banks 122X and the auxiliary column banks 532 and 533 form openings corresponding to the self light emitting regions 100a.

(Disposition of Column Banks 522Y, Auxiliary Column Banks 532 and 533)

The column banks 522Y which are insulating layers that extend linearly in the column direction between the auxiliary electrode layers 200 and the pixel electrodes 119R adjacent to each other in the row direction are disposed on the interlayer insulating layer 118, and are above the edges 200a2 of the auxiliary electrode layers 200 and above edges 119a3 of the pixel electrodes 119R. The auxiliary electrode layers 200 and the pixel electrodes 119R that are adjacent in the row direction are insulated from each other by the column banks 522Y.

The column banks 522Y which are insulating layers that extend linearly in the column direction between the pixel electrodes 119R and the pixel electrodes 119G adjacent to each other in the row direction are disposed on the interlayer insulating layer 118, and are above edges 119a4 of the pixel electrodes 119R and edges 119a3 of the pixel electrodes 119G The pixel electrodes 119R and the pixel electrodes 119G that are adjacent in the row direction are insulated from each other by the column banks 522Y.

The column banks 522Y and the auxiliary column banks 532 which are insulating layers that extend linearly in the column direction between the pixel electrodes 119G and the pixel electrodes 119B adjacent to each other in the row direction are arranged in parallel to each other. The column banks 522Y are on the interlayer insulating layer 118 and above the edges 119a4 of the pixel electrodes 119G, while the auxiliary column banks 532 are on the interlayer insulating layer 118 and above the edges 119a3 of the pixel electrodes 119B. The pixel electrodes 119G and the pixel electrodes 119B adjacent to each other in the row direction are insulated from each other by the column banks 522Y and the auxiliary column banks 532.

Moreover, the auxiliary column banks 533 and the column banks 522Y which are insulating layers that extend linearly in the column direction between the pixel electrodes 119B and the auxiliary electrode layers 200 adjacent to each other in the row direction are arranged in parallel to each other. The auxiliary column banks 533 are on the interlayer insulating layer 118 and above the edges 119a4 of the pixel electrodes 119B, and the column banks 522Y are above the edges 200a1 of the auxiliary electrode layers 200. The pixel electrodes 119B and the auxiliary electrode layers 200 adjacent to each other in the row direction are insulated from each other by the auxiliary bank layers 533 and the column banks 522Y.

Gaps between the column banks 522Y adjacent to each other are defined as gaps 522z. Gaps between the auxiliary column banks 532 and the auxiliary column banks 533 adjacent to each other are defined as auxiliary gaps 523.

The gaps 522z include red color gaps 522zR, green color gaps 522zG, blue color gaps 522zB, and auxiliary gaps 522zA. The self light emitting regions 100aR are present in the red color gaps 522zR. The self light emitting regions 100aG are present in the green color gaps 522zG. The blue color gaps 522zB include the auxiliary gaps 523, and the self light emitting regions 100aB are present in the auxiliary gaps 523. The auxiliary gaps 522zA correspond to areas where the auxiliary electrode layers 200 are disposed.

Hereafter, the gaps 522zR, 522zG, 522zB, and the auxiliary gaps 522zA are referred to as "gaps 522z" where no distinction is made between them.

Thus, the column banks 522Y and the gaps 522z are aligned in pairs in the row direction. Moreover, the self light emitting regions 100a and non self light emitting regions 100b are aligned in pairs in the column direction in each of the gaps 522zR, 522zG, and 522zB.

(Configuration of Column Banks 522Y, Auxiliary Column Banks 532 and 533)

The column banks 522Y and the auxiliary column banks 532 and 533 are each in a linear shape, extending in the column direction. When the column banks 522Y and the auxiliary column banks 532 and 533 are cut parallel to the row direction, each cross section has a tapered trapezoidal shape tapering upwards.

Widths of the regions in the row direction where each of the column banks 522Y and the auxiliary column banks 532 and 533 are disposed are larger than δX2 by defined widths.

With respect to lyophilicity with liquid ink, the material characteristics of the auxiliary column banks 532 and 533 may be the same as that of the column banks 522Y.

In FIG. 6, each of the column banks 522Y are provided with an upper layer 522YU and a lower layer 522YL. The upper layer 522YU may have liquid repellency more than a defined value with respect to liquid ink, while the lower layer 522 YL and the auxiliary column banks 532 and 533 may have liquid repellency less than a defined value.

Height H2 of the auxiliary column banks 532 and 533 measured from the surface of the interlayer insulating layer 118 is equivalent to the height of the lower layers 522YL measured from the surface of the interlayer insulating layer 118. Height H2 of the auxiliary banks 532 and 533 measured from the surface of the interlayer insulating layer 118 is lower than the height H1 of the column bank 522Y measured from the surface of the interlayer insulating layer 118. Therefore, H1>H2.

For example, if H1=H2, wherein the height H2 of the auxiliary column banks 532 and 533 is the same as the height H1 of the column banks 522Y, the surface flatness of the light emitting layers in the gaps between the auxiliary column banks 532 and 533 is not different from the surface flatness of light emitting layers between the column banks 522Y adjacent to each other. Thus, the auxiliary column banks 532 and 533 do not have particular functions.

When H1>H2, if H2 is almost equal to H1, whereby H1 and H2 have a minimal difference, the surface flatness of the light emitting layers in the gaps of the auxiliary column banks 532 and 533 is not different from the surface flatness of the light emitting layers between the column banks 522Y adjacent to each other, thus the auxiliary column banks 532 and 533 have no particular functions as in the case of H1=H2.

Moreover, when H1>H2, if a difference between H1 and H2 is extremely large, the auxiliary column banks 532 and 533 are covered by the liquid ink applied in the gaps between the column banks 522Y, making the auxiliary column banks 532 and 533 unable to fulfill their particular functions.

(Relationship of Column Banks 522Y, Auxiliary Column Banks 532 and 533, and Self Light Emitting Regions)

The column banks 522Y define the edges of the self light emitting regions 100aR of the red sub-pixels 100seR in the row direction, and define the edges of the self light emitting regions 100aG of the green sub-pixels 100seG in the row direction. Moreover, the auxiliary column banks 532 and 533 define the edges of the self light emitting regions 100aB of the blue sub-pixels 100seB in the row direction (FIG. 4).

Accordingly, the column banks 522Y, the auxiliary column banks 532 and 533 define the edges of the self light emitting regions of each sub-pixel in the row direction.

(Function of Column Banks 522Y, Auxiliary Column Banks 532 and 533)

In FIG. 4, the column banks 522Y block the liquid ink including an organic compound which is a material of the light emitting layers 123 from flowing in the row direction, and define the edges in the row direction of the light emitting layers 123.

The auxiliary column banks 532 and 533 each control flow of the liquid ink including an organic compound, which is a material of the light emitting layers 123, in the row direction. The auxiliary column banks 532 and 533 are provided to planarize the thickness of the liquid ink applied between the auxiliary column banks 532 and the auxiliary column banks 533. Thus, the auxiliary column banks 532 and 533 have lyophilicity with respect to the liquid ink which is a defined value or more.

The pixel electrodes 119 are not exposed where the column banks 522Y and the auxiliary column banks 532 and 533 are present. Thus, regions where the column banks 522Y and the auxiliary column banks 532 and 533 are present emit no light and do not add to luminance.

The column banks 522Y adjacent to the pixel electrodes 119R and the pixel electrodes 119G cover the edges 119a3 and 119a4 in the row direction of the pixel electrodes 119R and 119G This prevents an electrical current leakage between the pixel electrodes 119R, 119G and the common electrode layer 125.

Moreover, the auxiliary column banks 532 and 533 cover the edges 119a3 and 119a4 in the row direction of the pixel electrodes 119B. This prevents electrical current leakage between the pixel electrodes 119B and the common electrode layer 125.

(Arrangement of Row Banks 122X)

In FIG. 4 and FIG. 7, the pixel electrodes 119 (first pixel electrodes) and the pixel electrodes 119 (second pixel electrodes) adjacent to the first pixel electrodes in the column direction have the row banks 122X in between, which extend linearly in the row direction. The row banks 122X are on the interlayer insulating layer 118, above the contact regions 119b of the pixel electrodes 119 in the interlayer insulating layer 118, above the edges 119a2 of the first pixel electrodes, and above the edges 119a1 of the second pixel electrodes.

(Configuration of Row Banks 122X)

The row banks 122X are in a linear shape extending in the row direction (FIG. 4). The row banks 122X have tapered trapezoidal shapes tapering upward when viewed from a cross section taken along the column direction (FIG. 7). The row banks 122X are in the row direction orthogonal to the column direction, passing through the column banks 522Y and the auxiliary column banks 532 and 533 (FIG. 4, FIG. 5).

In FIG. 5 and FIG. 7, the row banks 122X have upper surfaces 122Xb located in a lower position than upper surfaces 522Yb of the column banks 522Y. In other words, the height H2 of the row banks 122X from the surface of the interlayer insulating layer 118 is lower than the height H1 of the column banks 522Y from the surface of the interlayer insulating layer 118. Therefore, H1>H2. The height H2 of the row banks 122X from the surface of the interlayer insulating layer 118 is the same as the height H2 of the auxiliary column banks 532 and 533 from the surface of the interlayer insulating layer 118.

(Relationship of Row Banks 122X and Self Light Emitting Regions)

In FIG. 4 and FIG. 7, regions where the row banks 122X are disposed are the non self light emitting regions 100b in which organic electroluminescence does not occur in the light emitting layers 123 above the pixel electrodes 119. Thus, the edges in the column direction of the self light emitting regions 100a are defined by the edges in the column direction of the row banks 122X.

(Function of Row Banks 122X)

Pixel electrodes 119 adjacent to each other in the column direction are insulated from each other by the row banks 122X (FIG. 7).

The row banks 122X are for controlling flow of the liquid ink including organic compounds, which are materials of the light emitting layers 123, in the column direction. Thus, the row banks 122X have lyophilicity with respect to the liquid ink that is a defined value or more. Accordingly, the row banks 122X are configured to reduce or substantially eliminate variation in ink volume applied between the sub-pixels.

The pixel electrodes 119 are not exposed where the row banks 122X are present, and such regions where the row banks 122X are present do not emit light and thus do not add to luminance.

The column direction length of the non self light emitting regions 100b where the row banks 122X are present is longer than a distance δY which is the length between the edges 119a1 in the column direction of the pixel electrodes 119 and the edges 119a2 in the column direction of the pixel electrodes 119 adjacent to each other by a defined length. Thus, the row banks 122X help prevent electrical current leak between the pixel electrodes 119 and the common electrode layer 125 by covering the edges 119a1 and 119a2 in the column direction of the pixel electrodes 119.

The row banks 122X define edges of the self light emitting regions 100a in the column direction of each of the sub-pixels 100se.

(Electrical Connection)

In FIG. 7, the non self light emitting regions 100b where the row banks 122X are disposed include the interlayer insulating layer 118 with the connecting recesses 119c (contact holes) that connect each one of the pixel electrodes 119 to a source S1 of a TFT, and the contact regions 119b (contact windows) on the pixel electrode layers 119 for electrical connection to the pixel electrodes 119.

(Example Values)

The height of the column banks 522 from the upper surface of the interlayer insulating layer 118 is, for example, 1 µm. The height of the row banks 122X from the upper surface of the interlayer insulating layer 118 is, for example, 0.5 µm. Further, the height of the auxiliary column banks 532 and 533 from the upper surface of the interlayer insulating layer 118 is, for example, 0.5 µm. Further, the width of the column banks 522 and the row banks 122X at the base is, for example, from 15 µm to 20 µm. Further, the width of the auxiliary column banks 532 and 533 at the base is, for example, from 2 µm to 5 µm.

Further, distance B1 between each auxiliary column bank 532 and each auxiliary column bank 533 is, for example, from 10 µm to 50 µm. Distance B2 between pairs of the column banks 522 adjacent to each other sandwiching auxiliary column banks 532 and auxiliary column banks 533 is, for example, from 30 µm to 80 µm. The relationship between the distances B1 and B2 is described by the following mathematical expression (see FIG. 5):

$$B1 > 1/2 \times B2$$

Further, the relationship of the height H2 of the auxiliary column banks 532 and 533 from the upper surface of the interlayer insulating layer 118, and thickness H3 of the light emitting layers 123 and of the upper layers 120B of the hole injection layers 120 is described by the following mathematical expression:

$$H3 < H2 < 2 \times H3$$

Further, distance B2 between pairs of the column banks 522Y adjacent to each other sandwiching the auxiliary column banks 532 and the auxiliary column banks 533 adjacent to each other may be wider than distance B3 between pairs of the column banks 522Y adjacent to each other sandwiching the red light emitting layers 123. Further, distance B2 between pairs of the column banks 522Y adjacent to each other sandwiching the auxiliary column banks 532 and the auxiliary column banks 533 adjacent to each other may be wider than distance B4 between pairs of the column banks 522Y adjacent to each other sandwiching the green light emitting layers 123 (see FIG. 5).

Further, distance B1 between the auxiliary column banks 532 and the auxiliary column banks 533 adjacent to each other may be wider than distance B3 between pairs of the column banks 522Y adjacent to each other sandwiching the red light emitting layers 123. Further, distance B1 between the auxiliary column banks 532 and the auxiliary column banks 533 adjacent to each other may be wider than distance B4 between pairs of the column banks 522Y adjacent to each other sandwiching the green light emitting layers 123 (see FIG. 5).

(Effects of Auxiliary Column Banks 532, 533)

In an organic EL display panel pertaining to at least one embodiment of the present disclosure, the height of the auxiliary column banks 532, 533 is lower than the height of the column banks 522Y. This structure helps to improve the film planarity of the light emitting layers 123 between the pairs of the auxiliary column banks 532 and 533, when compared with the film planarity of the light emitting layers 123 between the pairs of the column banks 522Y not having the auxiliary column banks 532 or 533 in between. Further, pairs of the column banks 522Y are higher than the auxiliary column banks 532, 533 and have a pair of auxiliary column banks 532 and 533 in between. This structure helps prevent occurrence of color mixings of liquid ink among the adjacent sub-pixels. As a result, occurrence of display defects can be reduced.

(5) Hole Transport Layer 121

In FIG. 6 and FIG. 7, the hole transport layers 121 are layered on the hole injection layers 120 which are on the row banks 122X and in the gaps 522zR, 522zG, and 522zB. The hole transport layers 121 are in contact with the upper layers 120B of the hole injection layer 120. The hole transport layers 121 transport holes injected from the hole injection layers 120 to the light emitting layers 123. Hereafter, the hole transport layers 121 disposed in the gaps 522zR, 522zG and 522zB are referred to as a hole transport layer 121R, a hole transport layer 121G and a hole transport layer 121B, respectively.

According to the present embodiment, in the gaps 522z as indicated later in the present description, the hole transport layers 121 and the upper layer 120B extend linearly in the column direction. However, the hole transport layers 121 in the gaps 522z can be discontinuous in the column direction.

(6) Light Emitting Layers 123

In FIG. 6 and FIG. 7, the light emitting layers 123 are layered on the hole transport layers 121. The light emitting layers 123 are formed by using an organic compound, and have a function of emitting light via internal recombination of holes and electrons. The light emitting layers 123 are disposed in a linear shape, extending in the column direction in the gaps 522zR, 522zG, and 522zB. In the gaps 522zR, 522zG, and 522zB defined by the column banks 522Y, the light emitting layers 123 are disposed extending in the column direction. The light emitting layers 123R, 123G, and 123B emitting the defined colors of light are respectively in the red color gaps 522zR corresponding to the self-light emitting regions 100aR in the red sub-pixels 100seR, the green color gaps 522zG corresponding to the self-light emitting regions 100aG in the green sub-pixels 100seG, and auxiliary gaps 523 corresponding to the self-light emitting regions 100aB in the blue sub-pixels 100seB.

Only portions of the light emitting layers 123 that are supplied carriers from the pixel electrodes 119 emit light, and therefore in regions where the row banks 122X and the auxiliary column banks 532 and 533 which are insulators exist between the light emitting layers 123 and the pixel electrodes 119, electroluminescence of the organic compounds does not occur. Thus, only the portions of the light emitting layers 123 where the row banks 122X and the auxiliary column banks 532, 533 are not present emit light. Such portions correspond to the self light emitting regions 100a, whereby the edges of the self light emitting regions 100a in the column direction are defined by the edges of the row banks 122X in the column direction.

Portions of the light emitting layers 123 above side surfaces and upper surfaces 122Xb of row banks 122X do not emit light, and such portions correspond to the non self light emitting regions 100b. The light emitting layers 123 are disposed on an upper surface of the hole transport layers 121 in the self light emitting regions 100a, and are disposed on an upper surface of the hole transport layers 121 on upper and side surfaces of the row banks 122X in the non self light emitting regions 100b.

The light emitting layers 123 extend continuously not only in the self light emitting regions 100a but also across the adjacent non self light emitting regions 100b. In this way, when forming the light emitting layers 123, the liquid ink applied to the self light emitting regions 100a can flow in the column direction via the liquid ink applied to the non self light emitting regions 100b, making equalizing of the film thickness between the pixels in the column direction possible. However, in the non self light emitting regions 100b, liquid ink flow is suppressed to an appropriate extent by the row banks 122X. Accordingly, large amounts of unevenness in film thickness in the column direction are unlikely to occur, and luminance uniformity between the pixels is improved.

Further, when forming the light emitting layers 123, liquid ink applied to the self light emitting regions 100aB flows over the auxiliary column banks 532 and 533 and flows in the row direction in the gaps 522zB, so that film thickness is equalized in the row direction in auxiliary gaps 523 between the auxiliary column banks 532 and 533.

(7) Electron Transport Layers 124

In FIG. 6 and FIG. 7, the electron transport layer 124 is layered covering the column banks 522Y and the gaps 522z defined by the column banks 522Y. The electron transport layer 124 is continuous across the whole display area of the organic EL display panel 10.

In FIG. 6 and FIG. 7, the electron transport layer 124 is on the light emitting layers 123. The electron transport layer 124 has a function of transporting electrons from the common electrode layer 125 to the light emitting layers 123 and a function of restricting injection of electrons into the light emitting layers 123.

In FIG. 6, the electron transport layer 124 is on the auxiliary electron layers 200. The electron transport layer 124 does not exist in portions (between edges 124a1 and 124a2, or between edges 124a3 and 124a4 of FIG. 6) of the connecting recesses 200b of the auxiliary electrode layers 200. The portions without the electron transport layer 124 expose the contact surfaces 200c of the auxiliary electrode layers 200.

(8) Common Electrode Layer 125

In FIG. 6 and FIG. 7, the common electrode layer 125 is on the electron transport layer 124. The common electrode layer 125 is an electrode common to all the light emitting layers 123.

In FIG. 6 and FIG. 7, the common electrode layer 125 is also on the electron transport layer 124 in regions above the pixel electrodes 119. The common electrode layer 125 forms conduction paths paired with the pixel electrode layers 119, sandwiching the light emitting layers 123. The common electrode layer 125 supplies carriers to the light emitting layers 123. For example, when the common electrode layer 125 functions as a cathode, it supplies electrons to the light emitting layers 123.

In FIG. 6, the common electrode layer 125 is also on the electron transport layer 124 in regions above the auxiliary electrode layers 200. The common electrode layer 125 is in direct contact with the contact surfaces 200c that are exposed in portions without the electron transport layer 124 (between edges 124a1 and 124a2, and between edges 124a3 and 124a4).

(9) Sealing Layer 126

The sealing layer 126 covers the common electrode layer 125. The sealing layer 126 is for suppressing deterioration of the light emitting layers 123 due to contact with moisture, air, and the like. The sealing layer 126 covers the upper surface of the common electrode layer 125.

(10) Joining Layer 127

Above the sealing layer 126 in the Z axis direction is a color filter substrate 131 including an upper substrate 130 and a color filter layer 128, whereby the color filter layer 128 is disposed on a principal surface at a lower side of the upper substrate 130 in the Z axis direction. The color filter substrate 131 is joined to the sealing layer 126 by a joining layer 127. The joining layer 127 has a function of joining a "back panel" which includes each layer from the substrate 100x to the sealing layer 126 to the color filter substrate 131, and has a function of preventing each layer from being exposed to moisture and air.

(11) Upper Substrate 130

The color filter substrate 131, which includes the color filter layer 128 formed on the upper substrate 130 is disposed above and joined to the joining layer 127. As the organic EL display panel 10 is a top-emission type of panel, the upper substrate 130 can be, for example, a light transmissive material such as a cover glass, a light transmissive resin film, or the like. Further, the upper substrate 130 can improve rigidity of the organic EL display panel 10, and help prevent intrusion of moisture, air, and the like.

(12) Color Filter Layer 128

The color filter layer 128 is on the upper substrate 130 at positions corresponding to the self light emitting regions 100a of the pixels. The color filter layer 128 is a light transmissive layer provided for allowing transmission of visible light of wavelengths corresponding to R, G, and B, and has a function of transmitting light emitted from each color pixel and correcting chromaticity of the transmitted light. For example, according to the present embodiment, red, green, and blue color filter layers 128R, 128G, and 128B are above the self light emitting regions 100aR in the red color gaps 522zR, the self light emitting regions 100aG in the green color gaps 522zG, and the self light emitting regions 100aB in the blue color gaps 522zB, respectively.

(13) Light Shielding Layers 129

The upper substrate 130 has light shielding layers 129 at positions corresponding to the boundaries between the self light emitting regions 100a of each pixels. The light shielding layers 129 are black resin layers which prevent transmission of visible light of wavelength corresponding to R, G, and B, and include a resin material with a black pigment having an excellent light absorbing property and a light shielding property, for example.

3.4.3 Materials

Here is an example of materials included in parts shown in FIG. 4 to FIG. 7.

(1) Substrate 100x (TFT Substrate)

The base material may be, for example, a glass substrate, a silica glass substrate, a silicon substrate, a metal substrate of a metal such as molybdenum sulfide, copper, zinc, aluminum, stainless steel, magnesium, iron, nickel, gold, or silver, a semiconductor substrate such as gallium arsenide, a plastic substrate or the like. As a plastic material with flexibility, a thermoplastic resin or a thermosetting resin may be used. Further, the base material may be a material with electrically insulating property such as a resin material. Publicly known materials can be used for TFT components such as a gate electrode, a gate insulating layer, a channel layer, a channel protecting layer, a source electrode, and a drain electrode. The gate electrode is, for example, a laminate of copper (Cu) and molybdenum (Mo). The gate insulating layer may be formed by using, for example, a publicly known organic material or an inorganic material if the material has an electrically insulating property like silicon oxide ($SiO_2$) or silicon nitride ($SiN_x$). The channel layer may be an oxide semiconductor including at least one of the materials selected from the group consisting of indium (In), gallium (Ga), zinc (Zn) and combinations thereof. The channel protecting layer can use, for example, silicon oxynitride (SiON), silicon nitride ($SiN_x$), or aluminum oxide ($AlO_x$) as a material. The source electrode and the drain electrode can use, for example, a laminate of copper manganese (CuMn), copper (Cu) and molybdenum (Mo) as a material.

For the interlayer insulating layer above the TFTs, silicon oxide ($SiO_2$), silicon nitride (SiN) and silicon oxynitride (SiON), or silicon oxide (SiO) and silicon oxynitride (SiON) can be used, for example. A connecting electrode layer of the TFTs can be, for example, a laminate of molybdenum (Mo), copper (Cu), and copper manganese (CuMn). Material used for the connecting electrode layer is not limited to these examples, but can be selected as appropriate from materials having electrical conductivity.

The interlayer insulating layer 118 disposed on an upper surface of the substrate 100x can be formed by using an organic compound such as polyimide resin, acrylic resin, siloxane resin, novolac-type phenolic resin, or the like.

(2) Pixel Electrodes 119 and Auxiliary Electrode Layers 200

The pixel electrodes 119 include a metal material. In the case of the organic EL display panel 10 according to the present embodiment which is a top-emission type of a panel, in which chromaticity of emitted light is adjusted by an adoption of an optical resonator structure whereby film thickness is optimally set to increase luminance, a surface portion of the pixel electrodes 119 has a high reflectivity. The pixel electrodes 119 in the organic EL display panel 10 according to the present embodiment may have a structure in which a plurality of films selected from a metal layer, an alloy layer, and a transparent conductive layer are layered. The metal layer can be formed by using a metal material including silver (Ag) or aluminum (Al), for example. The alloy layer can be formed by using a silver, palladium, and copper alloy (APC), a silver, rubidium, and gold alloy (ARA), a molybdenum-chromium alloy (MoCr), a nickel-chromium alloy (NiCr), or the like. The transparent conductive layer can be formed by using indium tin oxide (ITO), indium zinc oxide (IZO), or the like as a material.

The auxiliary electrode layers 200 include the same material as the pixel electrodes 119.

(3) Hole Injection Layers 120

The lower layers 120A of the hole injection layers 120 are layers formed by using, for example, an oxide of silver (Ag), molybdenum (Mo), chromium (Cr), vanadium (V), tungsten (W), nickel (Ni), iridium (Ir), and the like. When the lower layers 120A are formed by using a transition metal oxide, it will have multiple oxidation numbers and energy levels. As a result, injection of holes is facilitated and the voltage applied to each organic EL element is reduced. According to the present embodiment, the lower layers 120A include oxides of Tungsten (W). In such an embodiment, the oxides of Tungsten (W) contain pentavalent tungsten atoms by a defined ratio or more, since the voltage applied to the organic EL elements decreases as a ratio ($W^{5+}/W^{6+}$) of the pentavalent tungsten atoms to the hexavalent tungsten atoms increases.

The upper layers 120B of the hole injection layers 120, as described above, can use for example coating films formed by using an organic polymer solution of an electrical conductive polymer material such as poly(3,4-ethylenedioxythiophene) polystyrene sulfonate (PEDOT:PSS).

(4) Banks 122

The banks 122 are formed by using an organic material such as a resin, and have an insulation property. An organic material used to form the banks 122 may be, for example, acrylic resin, polyimide resin, novolac-type phenolic resin, or the like. The banks 122 may beneficially have an organic solvent resistance. Further, acrylic resin may be beneficially used. This is because the acrylic resin has a low refractive index and is suitable as a reflector.

Alternatively, when an inorganic material is used for the banks 122, silicon oxide (SiO) is beneficially used, for example, considering the refractive index. Alternatively, for example, an inorganic material such as silicon nitride (SiN), silicon oxynitride (SiON), or the like can be used for the banks 122.

Further, as the banks 122 may be treated with etching, baking, and the like during a manufacturing process, the banks 122 are beneficially formed by using a highly resistant material which does not excessively deform or alter from such treatments.

In order to make surfaces of the banks 122 liquid-repellant, the surfaces can be treated with fluorine. Further, the banks 122 may be formed by using a material containing fluorine. Alternatively, a lower liquid repellency of the surfaces of the banks 122 may be achieved by performing an ultraviolet irradiation on the surfaces and baking at a low temperature.

For the lower layers 522YL of the column banks 522Y, the auxiliary column banks 532, the auxiliary column banks 533, and the row banks 122X, a material with a defined value or more lyophilicity to the liquid ink is used. For the upper layers 522YU of the column banks 522Y, a material with a predetermined value or more liquid repellency to the liquid ink is used.

(5) Hole Transport Layers 121

The hole transport layers 121 can be formed by using, for example, a polyfluorene or a derivative thereof, or a polymer compound such as a polyarylamine or a derivative thereof, or a poly(9, 9-di-n-octylfluorene-alt-(1, 4-phenylene-((4-sec-butylphenyl) imino)-1, 4-phenylene) (TFB).

(6) Light Emitting Layers 123

The light emitting layers 123, as described above, have a function of emitting light in an excited state generated by recombination of injected holes and electrons. Thus, the light emitting layers 123 are formed by using a light emitting organic material that can be made into a film by a wet printing method.

In particular, for example, the light emitting layers 123 are beneficially formed by using a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

(7) Electron Transport Layers 124

The electron transport layers 124 are formed by using an organic material with high electron transportability. The organic material usable in the electron transport layers 124 is, for example, a π electron low molecular weight organic material such as an oxadiazole derivative (OXD), a triazole derivative (TAZ), or a phenanthroline derivative (BCP, Bphen). Alternatively, the electron transport layers 124 may include a layer formed by using an organic material with high electron transporting property, doped with a dopant metal selected from an alkali metal or an alkaline earth metal. The electron transport layers 124 may include a layer formed by using sodium fluoride. The alkali metal is, in particular, lithium (Li), natrium (Na), kalium (K), rubidium (Rb), cecium (Cs), or francium (Fr). The alkaline earth metal is, in particular, calcium (Ca), strontium (Sr), barium (Ba), or radium (Ra).

(8) Common Electrode Layer 125

The common electrode layer 125 is formed by using an electrically conductive light transmissive material. For example, indium tin oxide (ITO), indium zinc oxide (IZO), or the like may be used. Alternatively, an electrode of thin film silver (Ag), aluminum (Al), or the like may be used.

(9) Sealing Layer 126

The sealing layer 126 has a function of preventing organic layers such as the light emitting layers 123 from being exposed to moisture and air. The sealing layer 126 is formed by using, for example, a light-transmissive material such as silicon nitride (SiN), silicon oxynitride (SiON), or the like. Further, a sealing resin layer formed by using a resin material such as acrylic resin, silicone resin, or the like may be provided on the layer formed by using a material such as silicon nitride (SiN), silicon oxynitride (SiON), or the like.

When the organic EL display panel 10 is a top emission type display panel according to the present embodiment, the sealing layer 126 must include a light transmissive material.

(10) Joining Layer 127

The joining layer 127 is formed by using a material such as a resin adhesive, for example. For the joining layer 127, a light transmissive resin material such as acrylic resin, silicone resin, epoxy resin, or the like can be used.

(11) Upper Substrate 130

For the upper substrate 130, for example, a light transmissive material such as a glass substrate, a silica glass substrate, or a plastic substrate can be used.

(12) Color Filter Layer 128

For the color filter layer 128, a publicly known resin material (for example, as a commercially available product, color resists manufactured by JSR Corporation) or the like can be used.

(13) Light Shielding Layers 129

The light shielding layers 129 are formed by using a resin material which includes an ultraviolet curing resin (for example, ultraviolet curing acrylic resin) material as a primary component to which a black pigment is added. For the black pigment, for example, a light shielding material such as a carbon black pigment, a titanium black pigment, a metal oxide pigment, an organic pigment, or the like can be used.

3.5 Method of Manufacturing Organic EL Display Panel 10

The method of manufacturing an organic EL display panel 10 is described with reference to drawings in FIG. 8 to FIG. 15.

(1) Preparing Substrate 100x

Figure 8A:
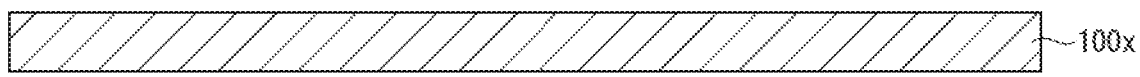
FIG. 8A to FIG. 8D are diagrams illustrating states in a manufacturing process of organic EL display panel 10 according to at least one embodiment. The figures are cross-sectional views taken at the same position as A1-A1 in FIG. 4.

Prepare a substrate 100x having wires and multiple TFTs including wires 110. The substrate 100x can be manufactured with a publicly known TFT manufacturing process (FIG. 8A).

(2) Forming Interlayer Insulating Layer 118

Figure 8B:
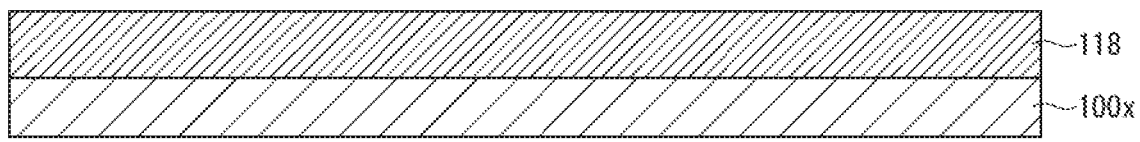

An interlayer insulating layer 118 is formed by coating the substrate 100x with a photoresist which is a component material (photosensitive resin material) of the interlayer insulating layer 118, and by planarizing the coated surface (FIG. 8B).

Figure 8C:
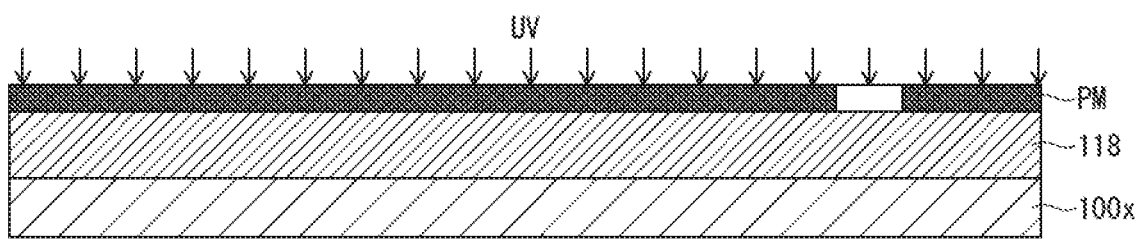

After forming the interlayer insulating layer 118, a photomask with defined openings is applied on the surface of the layer 118 to perform ultraviolet irradiation thereon, thus exposing the interlayer insulating layer 118 to the light and thereby transferring the pattern of the photomask to the interlayer insulating layer 118 (FIG. 8C).

Figure 8D:
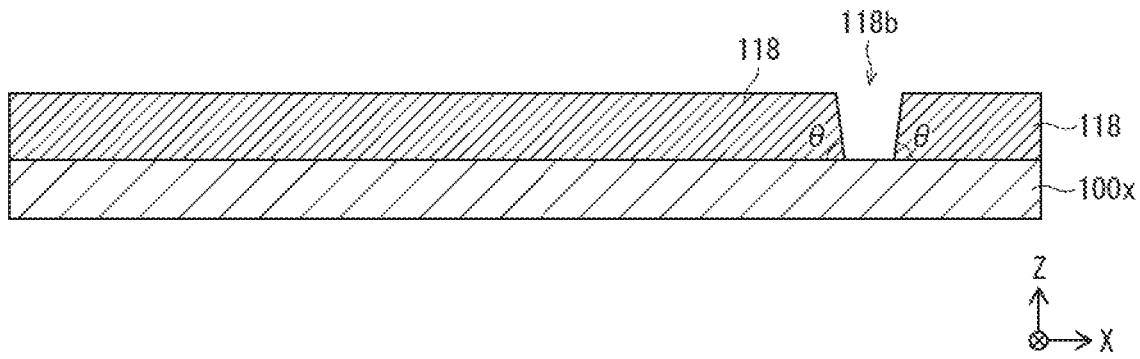

Then, the interlayer insulating layer 118 patterned with contact holes 118a (not illustrated in FIG. 8D, see FIG. 7) and contact holes 118b (see FIG. 6) is formed by developing (FIG. 8D). The wires 110 are exposed at the bottom portion of the contact holes 118a (not illustrated in FIG. 8D), and the substrate 100x is exposed at the bottom portion of the contact holes 118b.

According to the present embodiment, the interlayer insulating layer 118 is formed by using a positive type of photoresist. Alternatively, the interlayer insulating layer 118 may be formed by using a negative type of photoresist.

(3) Forming Pixel Electrodes 119 and Auxiliary Electrode Layers 200

Figure 9A:
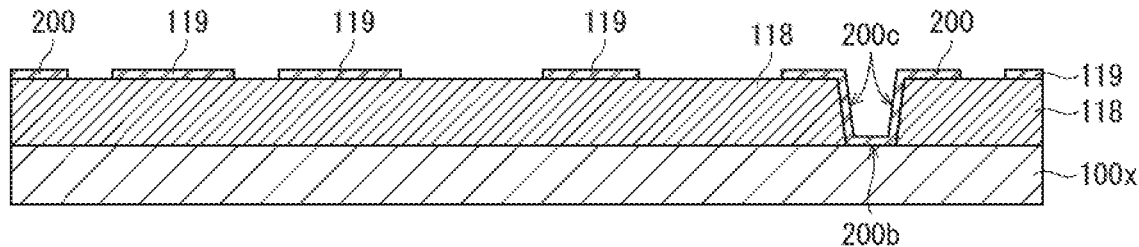
FIG. 9A to FIG. 9D are diagrams illustrating states in a manufacturing process of organic EL display panel 10 according to at least one embodiment. The figures are cross-sectional views taken at the same position as A1-A1 in FIG. 4.

After the interlayer insulating layer 118 is formed having the contact holes 118a and 118b, the pixel electrodes 119 and the auxiliary electrode layers 200 are formed (FIG. 9A).

The pixel electrodes 119 and the auxiliary electrode layers 200 are formed by forming metal films by sputtering and then patterning the metal films by photolithography and etching. During this process, the connecting recesses 119c of the pixel electrodes 119 are formed by forming a metal film along the interior wall of each of the contact holes 118a. Further, by forming the metal film along the interior wall of each of the contact holes 118b, the contact recesses 200b of the auxiliary electrode layers 200 having the contact surfaces 200c along the interior walls of the contact holes 118b are formed (FIG. 9A).

The pixel electrodes 119 directly connect to the wires 110 exposed at the bottom portion of the contact holes 118a, thereby electrically connecting to the TFT electrodes (See FIG. 7).

(4) Forming Lower Layers 120A of Hole Injection Layers 120

Figure 9B:
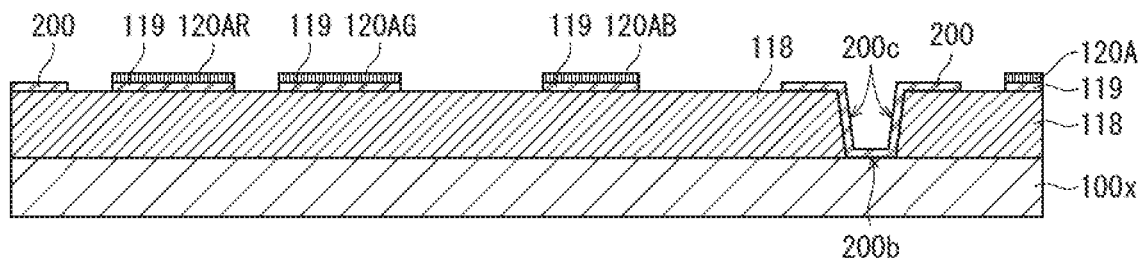

After forming the pixel electrodes 119 and the auxiliary electrode layers 200, the lower layers 120A of the hole injection layers 120 are formed on the pixel electrodes 119 (FIG. 9B).

The lower layers 120A are formed by forming a film including metal (for example, tungsten) by using a sputtering method or a vapor growth method such as a vapor deposition method, then by baking to oxidize, and then by patterning each pixel by photolithography and etching.

(5) Forming Banks 122

After forming the lower layers 120A of the hole injection layers 120, the banks 122 are formed covering the edges of the lower layers 120A and the auxiliary electrode layers 200.

Figure 9C:
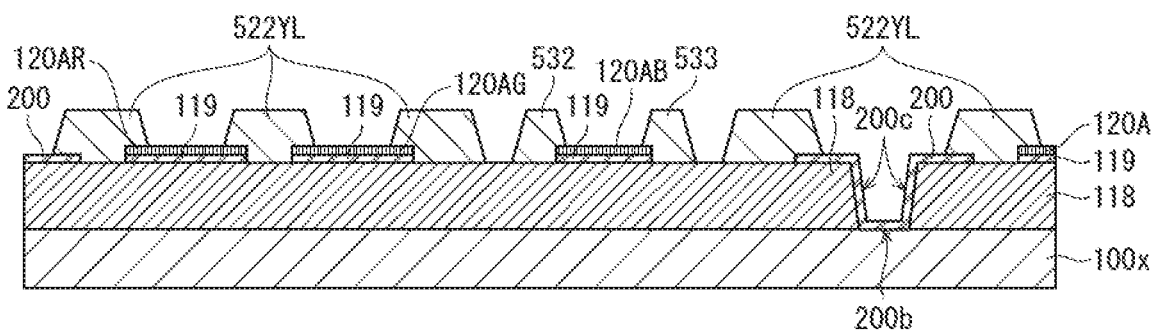
Figure 9D:
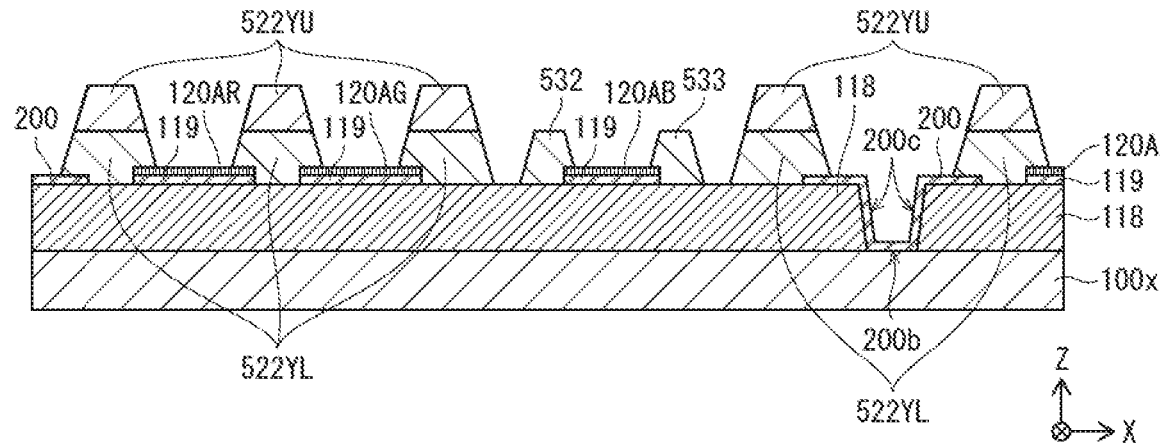

When forming the banks 122, the row banks 122X are formed first, then the lower layers 522YL of the column banks 522Y, the auxiliary column banks 532, and the auxiliary column banks 533 are formed (FIG. 9C). Next, the upper layers 522YU of the column banks 522Y are formed (FIG. 9D).

To form the banks 122, first, a film formed by using a material of the banks 122 (for example, a photosensitive resin material) is layered on each of the lower layers 120A of the hole injection layers 120 by using a spin coating method or the like. Then, the resin film is patterned to form the row banks 122X, the lower layers of the column banks 522Y, the auxiliary column banks 532, 533, and the upper layers 522YU of the column banks 522Y in this order. Patterning of the row banks 122X, the lower layers 522YL of the column banks 522Y, the auxiliary column banks 532, 533, and the upper layers 522YU of the column banks 522Y is performed by applying a photomask above the resin film, exposing to ultraviolet irradiation from above the photomask, then developing, and baking (at approximately 230° C. for approximately 60 minutes).

In particular, when forming the row banks 122X, first a photosensitive resin film formed by using an organic photosensitive resin material such as acrylic resin, polyimide resin, novolac-type phenolic resin, or the like is formed. After drying to partially volatize solvent, a photomask provided with predefined openings is overlaid, and ultraviolet irradiation is performed from above to expose a photoresist formed by using a photosensitive resin or the like, transferring the pattern of the photomask to the photoresist. Next, the photosensitive resin is developed to form patterned insulating layers of the row banks 122X. Typically, a positive type of photoresist is used. A positive type of photoresist is removed by developing portions exposed to light. The unexposed portion of the photoresist under the patterned mask remains undeveloped.

When forming the lower layers 522YL of the column banks 522Y, first a spin coating method is used to form a film by using a material of the column banks 522Y (for example, a photosensitive resin material). Then, the resin film is patterned to form the gaps 522z, thus forming the lower layers 522YL of the column banks 522Y. The gaps 522z are formed by positioning a mask above the resin layer, performing light exposure, and developing. The lower layers 522YL of the column banks 522Y extend in the column direction and alternate in the row direction with the gaps 522z. When forming the auxiliary column banks 532 and 533, first a spin coating method is used to form a film by using a material of the auxiliary column banks 532 and 533 (for example, a photosensitive resin material). The auxiliary column banks 532 and 533 are formed by positioning a mask above the resin layer, performing light exposure, and developing. Then, the resin film is patterned to form the auxiliary column banks 532 and 533. The auxiliary column banks 532 and 533 extend in the column direction in pairs in the blue color gaps 522zB. When forming the upper layers 522YU of the column banks 522Y, first a spin coating method is used to form a film by using a material of the upper layers 522YU of the column banks 522Y (for example, a photosensitive resin material). Then, the resin film is patterned to form the gaps 522z, thus forming the upper layers 522YU of the column banks 522Y. The gaps 522z are formed by positioning a mask above the resin layer, performing light exposure, and developing. The upper layers 522YU of the column banks 522Y extend in the column direction and alternate in the row direction with the gaps 522z.

(6) Forming Organic Function Layers

Figure 12A:
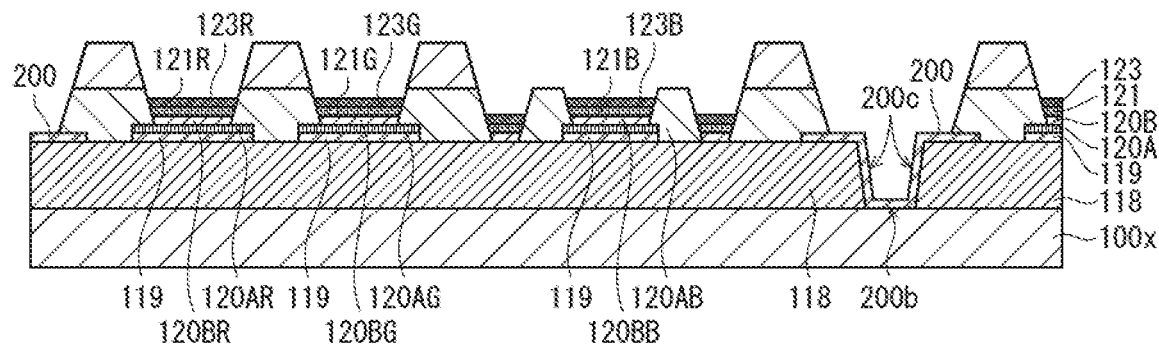
FIG. 12A to FIG. 12D are diagrams illustrating states in a manufacturing process of organic EL display panel 10 according to at least one embodiment. The figures are cross-sectional views taken at the same position as A1-A1 in FIG. 4.

On the lower layers 120A of the hole injection layers 120 formed in the gaps 522z which are defined by the row banks 522Y including on and above the column banks 122X, the upper layers 120B of the hole injection layers 120, the hole transport layers 121, and the light emitting layers 123 are formed layered in this order (FIG. 12A).

The upper layers 120B are formed by using an inkjet method, in which liquid ink including an electrically conductive polymer material such as poly(3,4-ethylenedioxythiophene) polystyrene sulfonate (PEDOT:PSS) is applied in the gaps 522z defined by the column banks 522Y, then by removing a solvent by volatilization or by baking. Subsequently, patterning of each pixel unit may be performed by photolithography and etching.

The hole transport layers 121 are formed by applying ink including the materials of the hole transport layers 121 in the gaps 522z defined by the column banks 522Y using a wet process such as an inkjet method or a gravure printing method, and by removing a solvent by volatilization or by baking. The liquid ink application method for forming the hole transport layers 121 in the gaps 522z is the same as the method used for forming the upper layers 120B described in at least one embodiment. Alternatively, the hole transport layers 121 are formed by forming and depositing of films including metal (for example, tungsten) using sputtering, and oxidizing the film by baking. Subsequently, patterning of each pixel unit may be performed by photolithography and etching.

Forming of the light emitting layers 123 is performed by using an inkjet method to apply ink liquid containing a material of the light emitting layers 123 into the gaps 522z defined by the column banks 522Y, then drying the liquid ink by baking.

In particular, in this process, liquid ink 123RI, 123GI, and 123BI containing R, G, and B organic light emitting layer material respectively are applied by an inkjet method to the gaps 522z, which are sub-pixel formation regions. The liquid ink is then dried under reduced pressure and baked to form the light emitting layers 123R, 123G, and 123B.

The following describes an application method of a solution for forming the light emitting layers 123.

Figure 10:
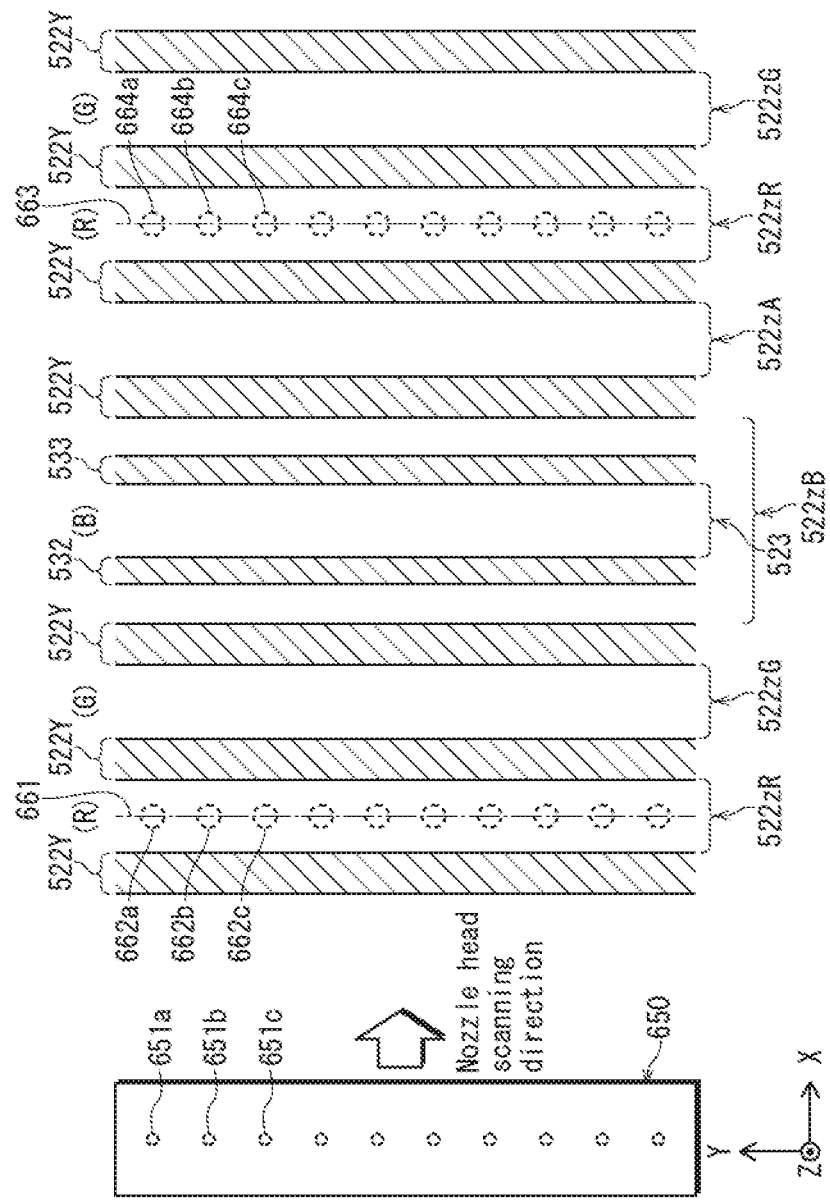
FIG. 10 is a schematic diagram of liquid ink discharge implemented by inkjet nozzle head 650 of a droplet ejecting device according to at least one embodiment.

In a process of applying the liquid ink of the light emitting layers 123, a solution for forming the light emitting layers 123 is applied by using a droplet ejecting device (not illustrated). The substrate 100x is placed on the working table of the droplet ejecting device in the state in which the substrate 100x has the column direction extending along the Y direction and the row direction extending along the X direction. In FIG. 10, an inkjet nozzle head 650 of the droplet ejecting device has ejection openings 651a, 651b, 651c . . . arranged linearly along the Y direction. First, a plurality of liquid ink deposition targets 662a, 662b, 662c . . . to which the liquid ink should be applied are set on a center line 661 to the column direction of a red color gap 522zR. Next, the inkjet nozzle head 650 is moved in the X direction. When the ejection openings 651a, 651b, 651c . . . arrive above the liquid ink deposition targets 662a, 662b, 662c . . . , the inkjet nozzle head 650 deposits the liquid ink materials.

After the liquid ink materials are deposited, a next set of liquid ink deposition targets 664a, 664b, 664c . . . for the next red color gap 522zR are set on the center line 663, and the inkjet nozzle head 650 is moved in the X direction. When the ejection openings 651a, 651b, 651c . . . arrive above the liquid ink deposition targets 664a, 664b, 664c . . . , the inkjet nozzle head 650 deposits the liquid ink materials. Thereafter, the inkjet nozzle head 650 similarly deposits the liquid ink materials to subsequent red color gaps 522zR.

After the liquid ink materials are deposited to all the red color gaps 522zR, liquid ink materials are deposited to all the green color gaps 552zG by the same process. After the liquid ink materials are deposited to all the green color gaps 522zG, liquid ink materials are deposited to all the blue color gaps 552zB by the same process.

Thus, liquid ink for forming the red light emitting layers above the substrate 100x is applied, then liquid ink for forming the green light emitting layers above the substrate 100x is applied, and then liquid ink for forming the blue light emitting layers above the substrate 100x is applied. As a result, red light emitting layers, green light emitting layers, and blue light emitting layers alternate across the substrate 100x in the row direction in FIG. 4.

The detailed process of liquid ink application for forming the upper layers 120B and for forming the hole transport layers 121 are similar to that for forming the light emitting layers 123 according to at least one embodiment.

Figure 11:
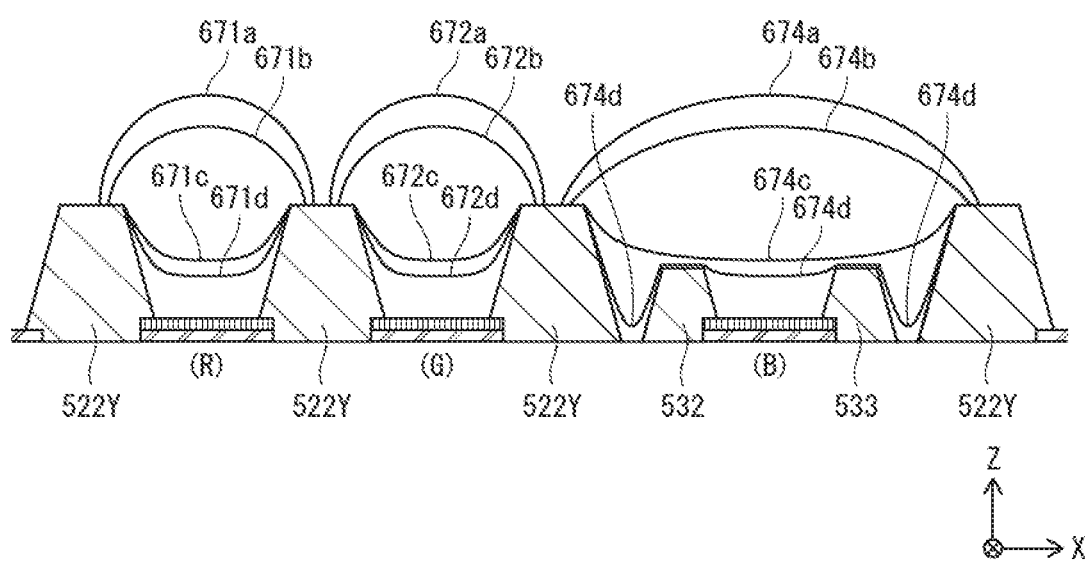
FIG. 11 is a schematic diagram of change over time of liquid ink surfaces in a drying process of light emitting layers 123 according to at least one embodiment.

FIG. 11 is a schematic diagram of change over time of liquid ink surfaces in a drying process of the light emitting layers 123.

Immediately after the ink material disposition, the red, green, and blue liquid ink surfaces protrude upward in the thickness direction of the substrate 100x respectively, as liquid ink surfaces 671a, 672a, and 674a in FIG. 11. Volume of liquid ink material droplets gradually decrease as drying proceeds. In FIG. 11, a red liquid ink surface of a red light emitting layer changes from a convex shape to a concave shape in the order of the liquid ink surfaces 671a, 671b, 671c, and 671d over time. A green liquid ink surface of a green light emitting layer changes from a convex shape to a concave shape in the order of liquid ink surfaces 672a, 672b, 672c, and 672d over time. A blue liquid ink surface of a blue light emitting layer changes from a convex shape to a concave shape in the order of liquid ink surfaces 674a, 674b, 674c, and 674d over time. The red liquid ink surface 671d and the green liquid ink surface 672d are planar surfaces. The blue liquid ink surface 674d between the auxiliary column banks 532 and 533 is a planar surface.

Methods of forming the upper layers 120B of the hole injection layers 120, the hole transport layers 121, and the light emitting layers 123 are not limited to those described above, and the liquid ink may be dropped and applied by a publicly known method other than an inkjet method or a gravure printing method, such as a dispenser method, a nozzle coating method, a spin coating method, intaglio printing, letterpress printing, or the like.

(7) Forming of Electron Transport Layer 124

Figure 12B:
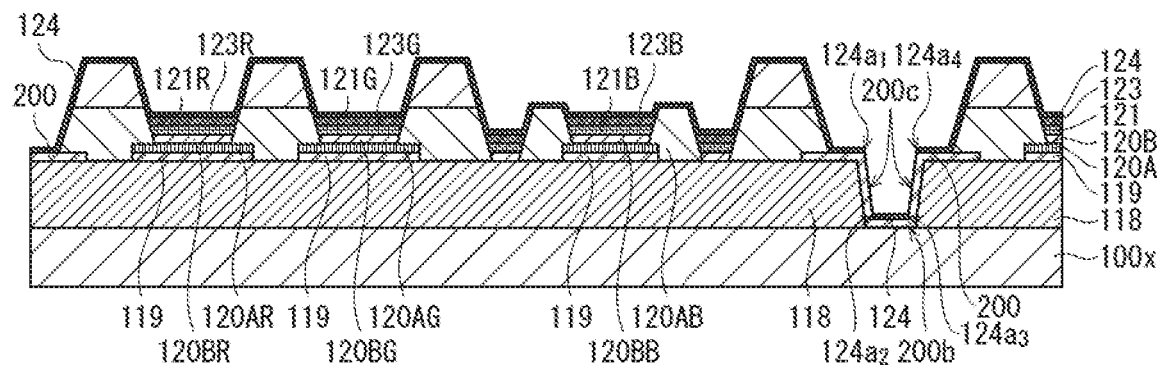

After forming the light emitting layers 123, the electron transport layer 124 is disposed being continuous on the display area of the organic EL display panel 10 including the auxiliary electrode layers 200, by using a method such as a vapor deposition method (FIG. 12B).

(8) Forming Common Electrode Layer 125

Figure 12C:
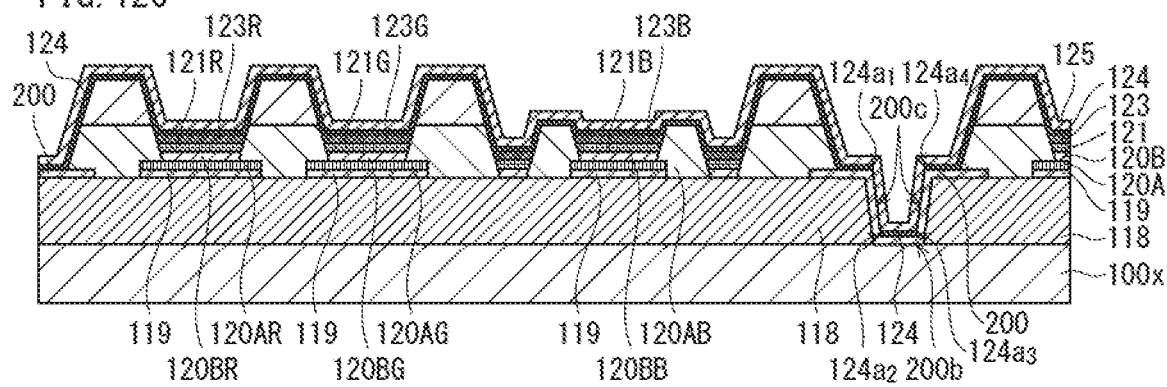

After forming the electron transport layer 124, the common electrode layer 125 is formed to cover the electron transport layer 124 by using a method such as sputtering (FIG. 12C). The common electrode layer 125 is also continuous on the electron transport layer 124 in regions above the auxiliary electrode layers 200.

The following further describes the method of forming the common electrode layer 125.

FIG. 15 is a schematic configuration of a sputtering device 600. The sputtering device 600 has a substrate delivering chamber 610, a film deposition chamber 620, and a load-lock chamber 630. Sputtering is performed in the film deposition chamber 620 by a magnetron sputtering method. Sputtering gas is introduced in the film deposition chamber 620. As the sputtering gas, an inert gas such as argon (Ar) is used. According to the present embodiment, Ar is used.

A carrier 621 in the sputtering device 600 has the substrate 622 as a film deposition target. The substrate 622 is attached to the carrier 621 in the substrate delivering chamber 610 by a substrate lifter 611. The carrier 621 with the substrate 622 attached moves linearly on the conveying path 601 from the substrate delivery chamber 610 to the load-lock chamber 630 via the film depositing chamber 620 at a constant speed. According to the present embodiment, the carrier 621 moves at a speed of 30 mm/s The substrate 622 is not heated and sputtering is performed at a room temperature.

The film depositing chamber 620 has a bar-shaped target 623. According to the present embodiment, the target 623 is indium tin oxide (ITO). The target 623 need not be bar-shaped and may be in a powder form, for example.

A power supply 624 applies electrical voltage to the target 623. In FIG. 15, the power supply 624 is an AC power supply, but it may be a DC power supply or a DC/AC hybrid power supply.

An exhaust system 631 exhausts the inside of the sputtering device 600, and a gas supply system 632 introduces sputtering gas into the film depositing chamber 620. When voltage is applied to the target 623 by the power supply 624, the sputtering gas generates plasma and sputters the surface of the target 623. Then, atoms sputtered from the target 623 are deposited on the substrate 622 to form a film.

A gas pressure applied to the sputtering gas Ar, for example, is 0.6 Pa, and a flow rate is 100 sccm.

(9) Forming Sealing Layer 126

Figure 12D:
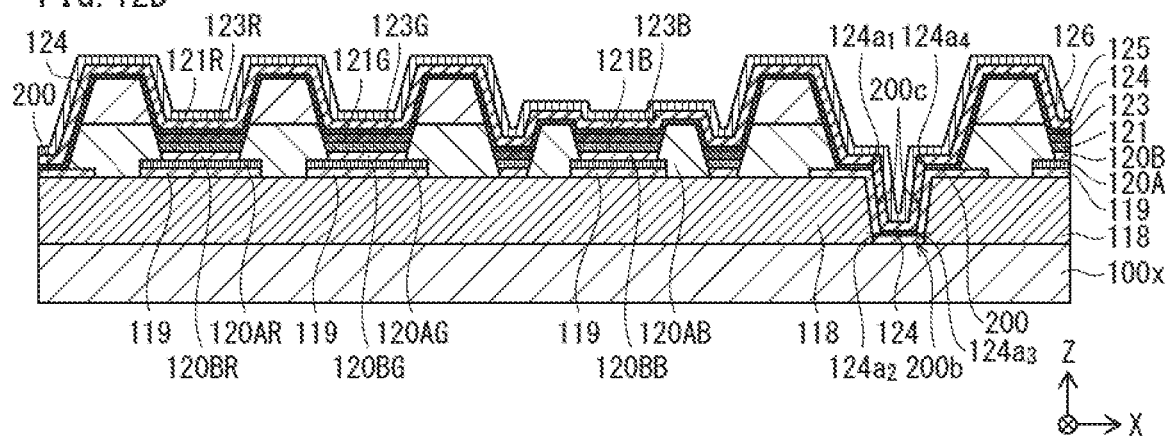

After forming the common electrode layer 125, the sealing layer 126 is formed (See FIG. 12D). The sealing layer 126 can be formed by using CVD, sputtering, or the like.

(10) Forming Color Filter Substrate 131

Next, a manufacturing process of the color filter substrate 131 is described with examples.

Figure 13A:
FIG. 13A to FIG. 13G are diagrams illustrating states in a manufacturing process of organic EL display panel 10 according to at least one embodiment. The figures are cross-sectional views taken at the same position as A1-A1 in FIG. 4.

The upper substrate 130, which is light-transmissive, is prepared, and the material of the light shielding layers 129 including an ultraviolet curable resin (for example, ultraviolet curable acrylic resin) material as a main component with a black pigment in addition, is applied on one side of the surface of the upper substrate 130 (FIG. 13A).

Figure 13B:
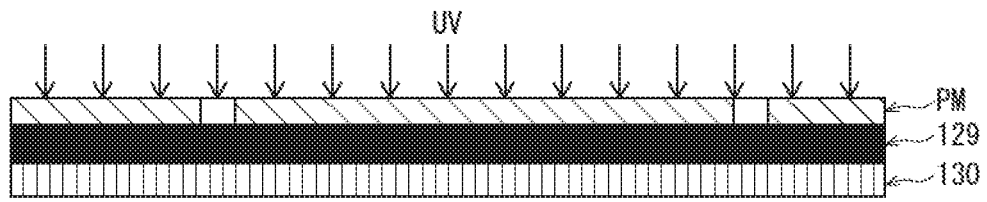

A patterned mask PM with predetermined openings is overlaid on the upper surface of the light shielding layer 129 whereon the material was applied, and is irradiated with ultraviolet light (FIG. 13B).

Figure 13C:
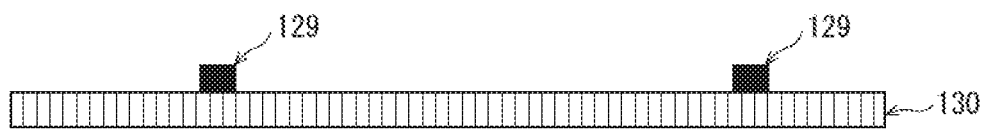

Then, by removing the patterned mask PM and uncured portions of the light shielding layer 129, developing, and curing, the light shielding layer 129 is completed for example in a substantially rectangular cross-sectional shape (FIG. 13C).

Figure 13D:
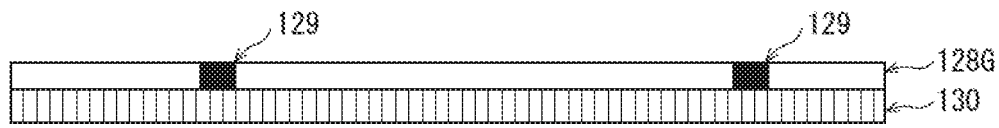
Figure 13E:
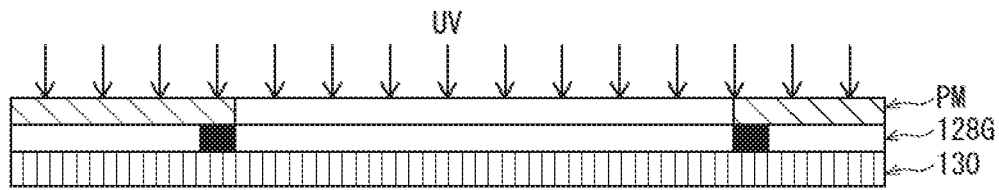

Next, a material 128G of the color filter layers 128 (for example, G) mainly including an ultraviolet curing resin component is applied (FIG. 13D) to the surface of the upper substrate 130 on which the light shielding layer 129 is formed, then a predetermined patterned mask PM is overlaid for irradiation with ultraviolet light (FIG. 13E).

Then, the color filter layer 128G is formed (FIG. 13F) by curing, removing the patterned mask PM and the uncured portions of the material 128G, and developing.

Figure 13F:
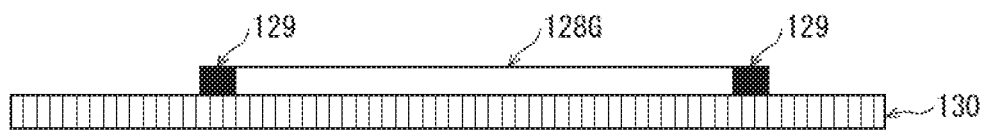
Figure 13G:
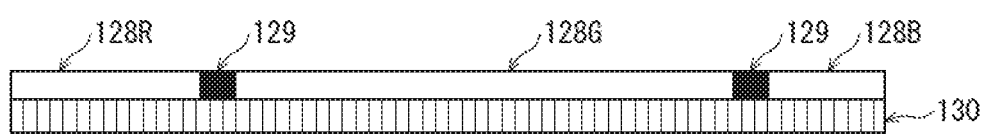

The color filter layers 128R and 128B are formed (FIG. 13G) by performing the same processes in FIG. 13D, 13E, and 13F to color filter materials of respective colors. Alternatively, a commercially available color filter product may be used instead of the color filter material.

Thus, the color filter substrate 131 is formed.

(11) Joining of Color Filter Substrate 131 and Back Panel

Figure 14A:
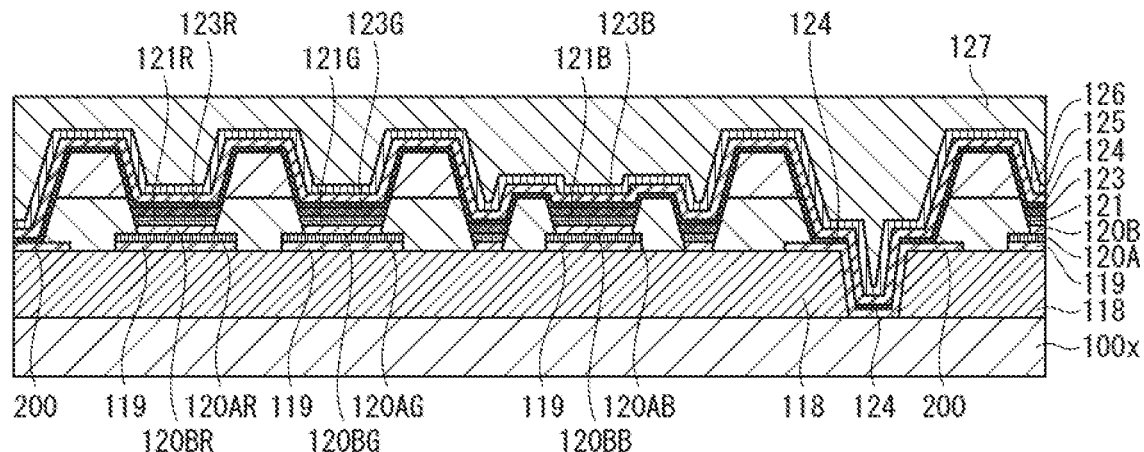
FIG. 14A and FIG. 14B are diagrams illustrating states in a manufacturing process of organic EL display panel 10 according to at least one embodiment. The figures are cross-sectional views taken at the same position as A1-A1 in FIG. 4.

In this process, first, a material of the joining layer 127 mainly including ultraviolet light curing resin such as acrylic resin, silicone resin, epoxy resin, or the like, is applied to the back panel which includes every layer from the substrate 100x to the sealing layer 126 (FIG. 14A).

Figure 14B:
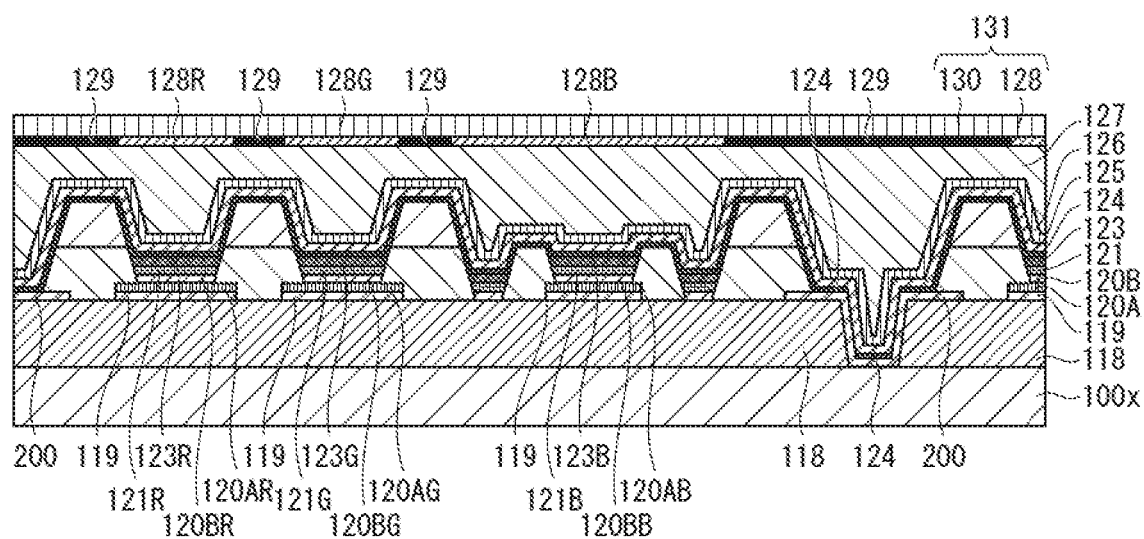

Next, the applied material is irradiated with ultraviolet light, and the back panel and the color filter substrate 131 are joined while matching positions relative to each other. No gas should enter between the back panel and the color filter substrate 131 at this time. Finally, a sealing process is complete by baking the back panel and the substrate 131, thus creating the organic display panel 10 (FIG. 14B).

3.6 Relationship Between Column Bank Heights and Planarization

Researchers of the present disclosure have measured shapes of the printed films of the light emitting layers in the organic EL elements when the column banks are changed into two different heights. The experiment results are described below.

Figure 19A:
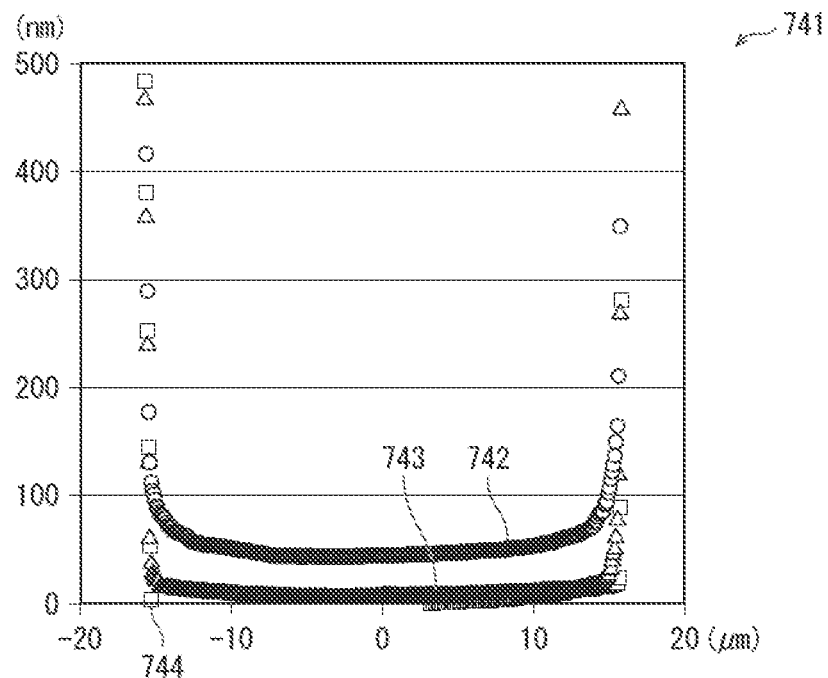
FIG. 19A is a graph of shapes of printed films of light emitting layers and the like according to at least one embodiment when column banks are 1 μm high.
Figure 19B:
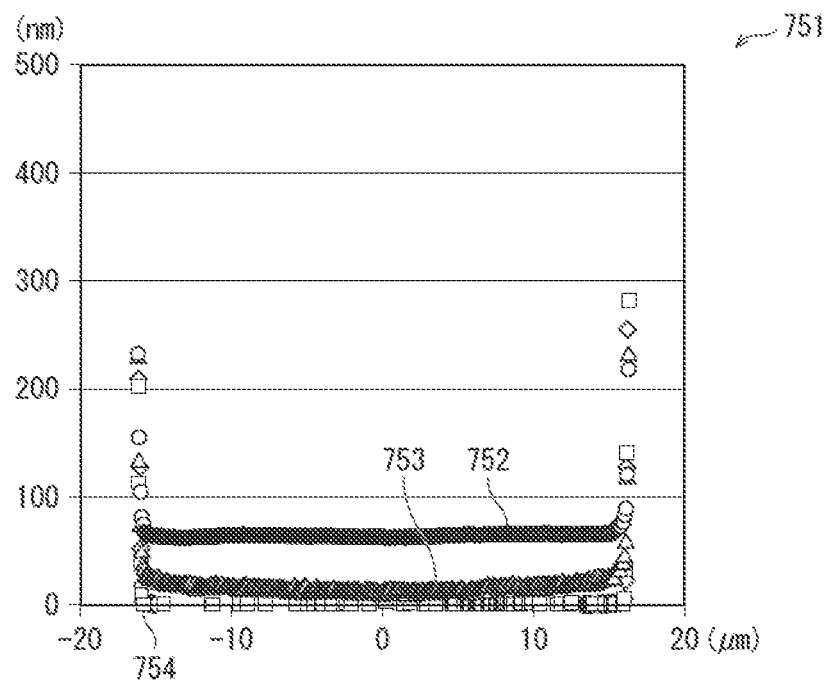
FIG. 19B is a graph of shapes of printed films of light emitting layers and the like when column banks are 0.5 μm high according to at least one embodiment.

FIG. 19A is a graph of measurement results indicating shapes of the printed films of the light emitting layers when a height of the column banks is 1 μm (reference example). FIG. 19B is a graph of measurement results indicating shapes of the printed films of the light emitting layers when the height of the column banks is 0.5 μm (embodiment).

In FIG. 19A and 19B, horizontal axes are positions along the light emitting surfaces the organic EL elements, and origins of the horizontal axes (position marked "0" on horizontal axes) are center points of the light emitting surfaces of the organic EL elements. In addition, vertical axes are positions in the direction perpendicular to the light emitting surfaces, and origins of the vertical axes (position marked "0" on vertical axes) are the surfaces of the pixel electrodes of the organic EL elements.

In FIG. 19A, curve 742 indicates a shape of the surface of the light emitting layer and curve 743 indicates a shape of the surface of the hole injection layer. Curve 744 indicates a shape of the surface of the pixel electrode of the organic EL element and a shape of the side surface of the bank. Further, in FIG. 19B, curve 752 indicates a shape of the surface of the light emitting layer and curve 753 indicates a shape of the surface of the hole injection layer. Curve 754 indicates a shape of the surface of the pixel electrode of the organic EL element and a shape of the side surface of the bank.

The surface of the light emitting layer in FIG. 19B (curve 752) which is an embodiment is more planarized than that in FIG. 19A (curve 742) which is a reference example.

Figure 20:
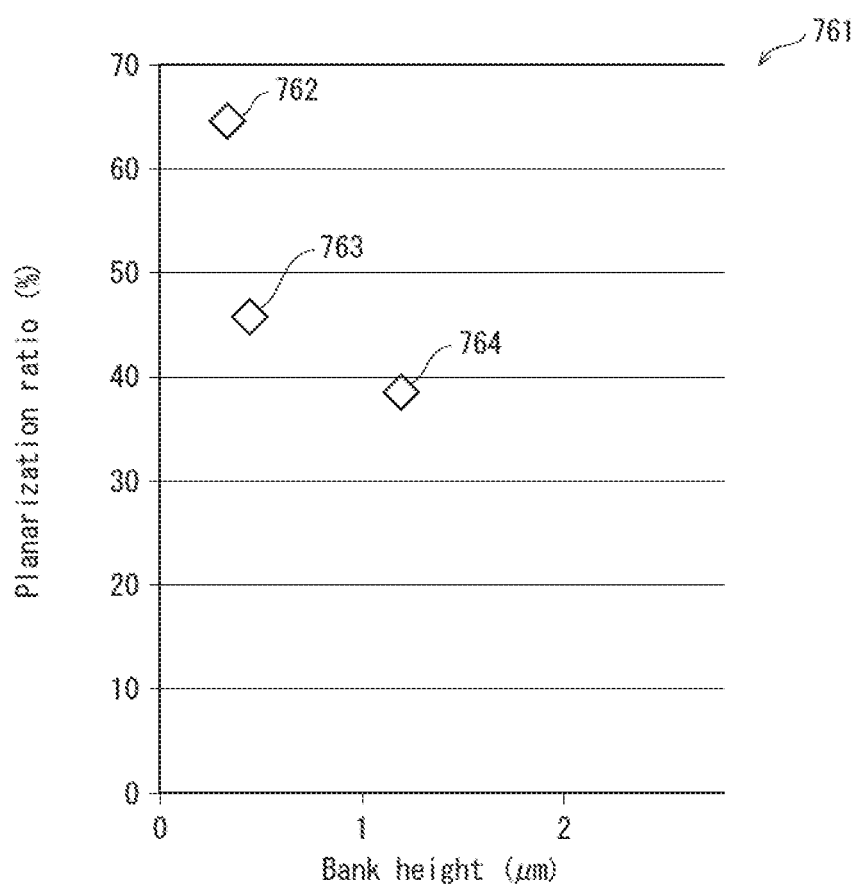
FIG. 20 is a graph of the relationship between column bank heights and planarization ratios according to at least one embodiment.

FIG. 20 is a graph of an experimental result of planarization ratios of the printed films of the light emitting layers with varied bank heights. In FIG. 20, a horizontal axis indicates the heights of the banks. Likewise, a vertical axis in FIG. 20 indicates planarization ratios of the printed films of the light emitting layers.

In FIG. 20, the planarization ratio of the printed films of the light emitting layers in a pixel is increased when the column bank heights are decreased. The planarization ratio is defined here as follows.

planarization ratio(%)=width W1/width W2×100

The width W2 herein is a row directional width of the light emitting layers in the pixel. Further, a length of the width W1 herein is twice the distance from a central portion in the row direction of the light emitting layer to a portion where thickness changes by 1.97 nm in a thickness direction compared to the thickness in the central portion in the row direction of the light emitting layer.

A target value of the planarization ratio is, for example, 50%.

As described above, the height of the banks affects the planarization ratio of the film shapes of the light emitting layers. That is, the planarization ratio is increased when the banks have a low height compared to that when the banks have a high height.

Figure 21:
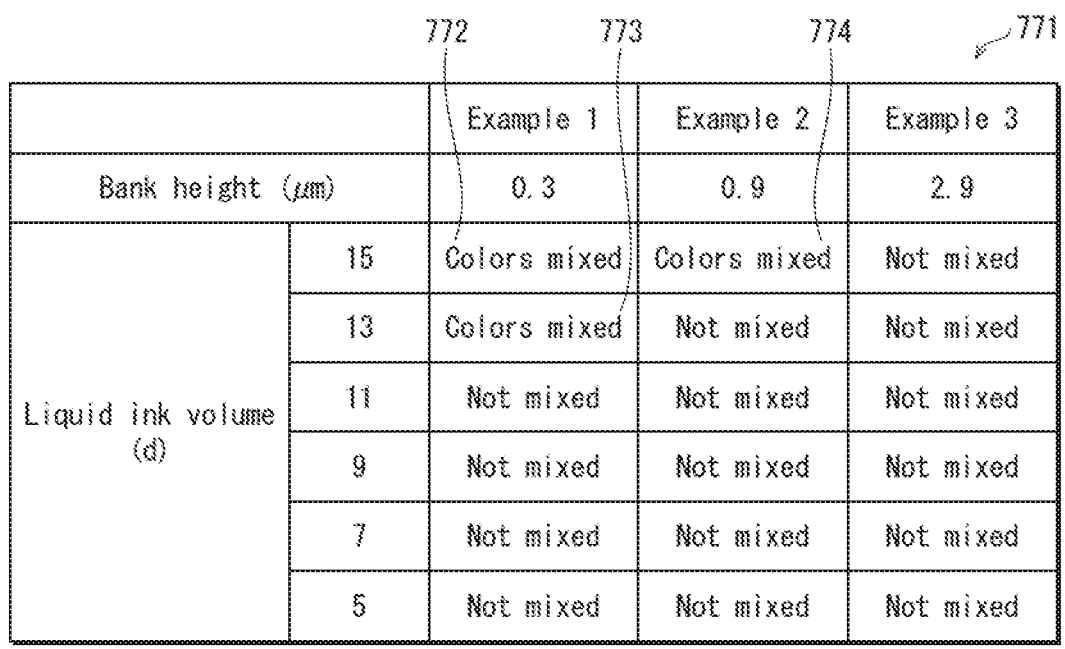
FIG. 21 is a table of occurrence of color mixing when column bank heights and liquid ink volumes are changed for printed films of light emitting layers according to at least one embodiment.

3.7 Ink Mixing when Forming Printed Films with Varied Column Bank Heights and Ink Volumes Researchers of the present disclosure have formed the printed films with varied column bank heights and ink liquid volumes to examine mixing of colors between adjacent pixels. FIG. 21 is a table indicating presence of color mixings when the printed films of the light emitting layers are formed with varied column bank heights and liquid ink volumes.

In FIG. 21, the colors are mixed between the light emitting layers of adjacent organic EL elements when the height of the column banks is 0.3 μm and the liquid ink volume (ink droplet amount) is 15 d or 13 d. The liquid ink volume (liquid ink droplet amount) herein corresponds to the three sub-pixels R, G, and B, and d=4 picoliter (pL). Moreover, colors are mixed between the light emitting layers of the adjacent organic EL elements when the height of the column banks is 0.9 μm and the liquid ink volume is 15 d.

However, when the height of the column banks is 0.3 μm and the liquid ink volume is 5 d to 11 d, when the height of the column banks is 0.9 μm and the liquid ink volume is 5 d to 13 d, and when the height of the column banks is 2.9 μm and the liquid ink volume is 5 d to 15 d, the colors are not mixed between the light emitting layers of the adjacent organic EL elements.

Therefore, the planarization ratio is increased when the banks have a low height compared to that when the banks have a high height, but the colors between the light emitting layers of the adjacent organic EL elements may mix when the column banks have a low height.

3.8 Conclusion

In the organic EL display panel according to at least one embodiment of the present disclosure, by setting the height of the auxiliary column banks 532, 533 lower than the height of the column banks 522Y, the planarity of the film shapes of the light emitting layers 123 formed between pairs of the auxiliary column banks 532, 533 can be increased compared to the planarity of the film shapes of the light emitting layers 123 formed between pairs of the column banks 522Y not sandwiching the auxiliary column banks 532, 533. Further, color mixing of the liquid ink between adjacent pixels can be suppressed by providing pairs of the column banks 522Y which sandwich the auxiliary column banks 532 and 533 and are higher than the auxiliary column banks 532 and 533. Therefore, occurrence of display defects can be reduced.

3.9 Modifications

The organic EL display panel 10 pertaining to at least one embodiment has been described, but the present invention is not limited to the embodiments above. For example, various modifications of embodiments conceived by a person having ordinary skill in the art, and any combination of elements and functions of embodiments and modifications that do not depart from the spirit of the present invention are also included in the present invention. The following describes such embodiments of the organic EL display panel 10.

(1) In the organic EL display panel 10, the light emitting layers 123 are continuously extended in the column direction on the row banks. However, the light emitting layers 123 may be discontinuous and separated into individual pixels by the row banks.

(2) In the organic EL display panel 10, the column banks 522Y and the auxiliary column banks 532, 533 are disposed on the interlayer insulating layer 118 so the bases of the column banks 522Y do not contact with the bases of the auxiliary column banks 532, 533 adjacent to each other. However, the arrangement of the column banks is not limited to the embodiment above.

Figure 22:
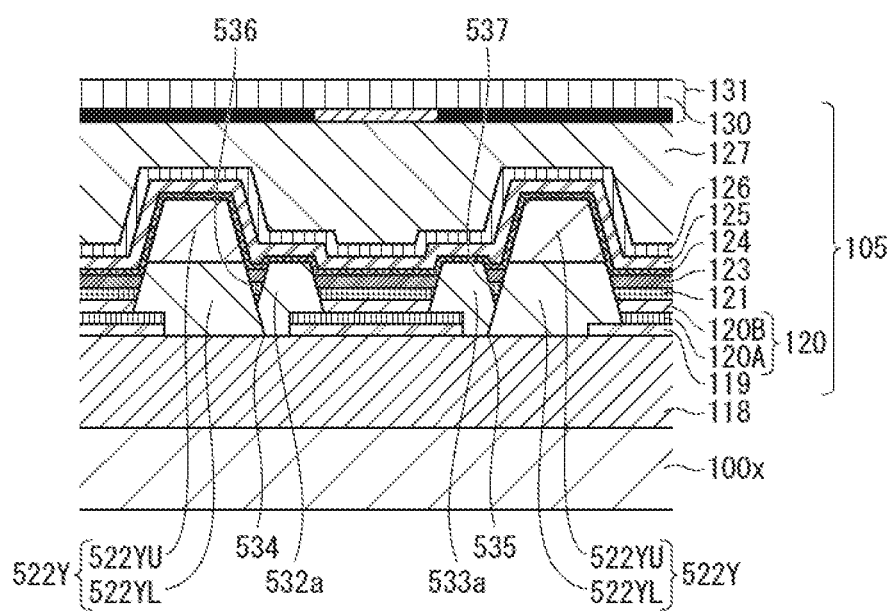
FIG. 22 is a cross-sectional view of a cross section of an organic EL display panel according to at least one embodiment corresponding to the cross section taken along line A1-A1 in FIG. 4.

FIG. 22 is a cross-sectional view of a cut surface of the organic EL display panel according to a modification corresponding to the cut surface taken along line A1-A1 in FIG. 4. In FIG. 22, auxiliary column banks 532a and the column banks 522Y can be disposed on the interlayer insulating layer 118 so bases 534 of the auxiliary column banks 532a contact with the bases of the column banks 522Y adjacent to each other. Further, the auxiliary column banks 533a and the column banks 522Y can be disposed on the interlayer insulating layer 118 so the bases 534 of the auxiliary column banks 533a contact with the bases of the column banks 522Y adjacent to each other.

Thus, the auxiliary column banks 532a and the column banks 522Y adjacent to each other have recesses 536 in between, and the auxiliary column banks 533a and the column banks 522Y adjacent to each other have recesses 537 in between.

Then, the liquid ink is applied between two column banks 522Y which surround at least one auxiliary column bank 532a and at least one auxiliary column bank 533a adjacent to each other. The surfaces of the liquid ink planarize between the auxiliary column banks 532a and the auxiliary column banks 533a as drying proceeds.

(3) An organic EL display panel 10 pertaining to at least one embodiment has, but is not limited to having, pixels in three different colors which are red, green, and blue color pixels in the sub-pixels 100se. For example, the light emitting layers may have a single color, or may have four different colors such as red, green, blue, and yellow colors. When the light emitting layers have the pixels of a single color, the color is blue.

(4) According to at least one embodiment, the organic EL display panel uses a configuration in which the hole injection layers 120, the hole transport layers 121, the light emitting layers 123, and the electron transport layer 124 are sandwiched between the pixel electrodes 119 and the common electrode layer 125. However, the present disclosure is not limited to the above configuration. For example, the configuration of the organic EL display panel may have only the light emitting layers 123 between the pixel electrodes 119 and the common electrode layer 125 instead of the hole injection layers 120, the hole transport layers 121, and the electron transport layer 124. Further, for example, the configuration of the organic EL display panel may have a layer or a plurality of layers selected from the group consisting of a hole injection layer, a hole transport layer, an electron transport layer, an electron injection layer, and combinations thereof. Further, at least one of those layers need not include organic compounds, and may include inorganic compounds.

(5) Further, according to at least one embodiment, a wet process such printing, spin coating, inkjets, or the like is used as a method of forming the light emitting layers 123, but the present disclosure is not limited to these examples. For example, a dry process can be used such as vacuum deposition, electron beam deposition, sputtering, reactive sputtering, ion plating, vapor phase growth, or the like. Further, publicly-known materials may be appropriately used as materials of each component.

(6) According to at least one embodiment, the organic EL display panel uses a configuration having the pixel electrodes 119 which are anodes disposed in lower portions of the organic EL elements and are connected to the wires 110 connected to the TFT source electrodes. Alternatively, the configuration having the counter electrode layers in the lower portions of the organic EL elements and the anodes disposed in upper portions may be used. In such a case, cathodes disposed in lower portions are connected to drains of the TFTs.

(7) In at least one embodiment, the organic EL display panel uses a configuration having two transistors $Tr_1$, $Tr_2$ provided for each of the sub-pixels 100se. However, the present disclosure is not limited to the configuration thereof. For example, the configuration may have a single transistor or more than three transistors corresponding to each of the sub-pixels.

(8) Further, according to at least one embodiment, the top emission type of the organic EL display panel is given as an example, but the present disclosure is not limited to the tope emission type. For example, a bottom emission type of the display panel or the like can be used. In such a case, each configuration can be changed appropriately.

(9) At least one embodiment described includes examples of the present disclosure. Values, shapes, materials, components, component positions and connections, processes, process order, and the like illustrated by at least one embodiment do not indicate limitations of the present invention. Further, among the elements of at least one embodiment, processes not described in the independent claims that recite top level concepts of the present disclosure are described as elements of different embodiments.

Further, the order of processes described above are examples for at least one embodiment of the present disclosure, and may be different from the order described above. Further, a part of the processes described above may be executed simultaneously (in parallel) with another process.

Further, in order to facilitate understanding of the present disclosure, scale of the elements in each of the drawings mentioned for the embodiment above may be different from actual scale. Further, the present invention is not limited by the description of the embodiments, and can be appropriately changed without departing from the scope of the present disclosure.

Further, at least part of the functions of at least one embodiment and various modifications thereof may be combined.

Further, the present disclosure includes various modifications of at least one embodiment that may be conceived of by a person having ordinary skill in the art.

The organic EL display panel and the organic EL display device pertaining to the present disclosure are widely useful in television sets, personal computers, portable telephones, and various other electronic devices having a display panel.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

What is claimed is:

1. An organic electroluminescence (EL) display panel having sub-pixels each emitting light of a color selected from a defined number of emitted colors and disposed in a matrix, the organic EL display panel comprising:
    a substrate;
    pixel electrodes disposed above the substrate in the matrix, corresponding to the sub-pixels, and including a light reflective material;
    main column banks extending in a column direction, each of the main column banks disposed at least between a pair of the pixel electrodes adjacent to each other in a row direction;
    pairs of auxiliary column banks extending parallel to the main column banks, disposed in gaps between pairs of the main column banks adjacent to each other where the pixel electrodes corresponding to the sub-pixels emitting light of a defined color selected from the emitted colors are present, each pair of the auxiliary column banks covering both edges in the row direction of each of the pixel electrodes therebetween;
    light emitting layers disposed in the gaps and including an organic light emitting material; and
    a common electrode layer extending continuously above the main column banks, the auxiliary column banks, and the light emitting layers, the common electrode layer including a light transmitting material, wherein
    a height of the auxiliary column banks from a surface of the substrate is lower than a height of the main column banks from the surface of the substrate.

2. The organic EL display panel of claim 1, wherein
a distance between the pair of the auxiliary column banks adjacent to each other is equal to or greater than half of a distance between the pair of the main column banks adjacent to each other sandwiching the pair of the auxiliary column banks.

3. The organic EL display panel of claim 1, wherein the defined color is blue.

4. The organic EL display panel of claim 1, further comprising
light emitting layers disposed in gaps between pairs of the main column banks adjacent to each other not sandwiching the pairs of the auxiliary column banks, and including organic light emitting materials of light emitting colors other than the defined color, wherein
a distance between the pairs of the main column banks adjacent to each other sandwiching the pairs of the auxiliary column banks is greater than a distance between the pairs of the main column banks adjacent to each other sandwiching the pixel electrodes corresponding to the sub-pixels emitting light of the color other than the defined color.

5. The organic EL display panel of claim 1, further comprising
hole injection layers disposed above the pixel electrodes, wherein
the light emitting layers are disposed above the hole injection layers, and
the height of the auxiliary column banks from the surface of the substrate is greater than a total film thickness of the light emitting layers and the hole injection layers, and is less than twice the total film thickness of the light emitting layers and the hole injection layers.

6. A method of manufacturing an organic EL display panel having sub-pixels each emitting light of a color selected from a defined number of emitted colors and disposed in a matrix, the method comprising:
    preparing a substrate;
    disposing pixel electrodes above the substrate in the matrix, corresponding to the sub-pixels, and including a light reflective material;
    forming main column banks extending in a column direction, each of the main column banks disposed at least between a pair of the pixel electrodes adjacent to each other in a row direction;
    forming pairs of auxiliary column banks with each pair of the auxiliary column banks extending parallel to the main column banks and disposed in gaps between a pair of the main column banks adjacent to each other where the pixel electrodes corresponding to the sub-pixels emitting light of a defined color selected from the emitted colors are present, forming the pairs of the auxiliary column banks covering both edges in the row direction of each of the pixel electrodes therebetween, forming a height of the auxiliary column banks from a surface of the substrate to be lower than a height of the main column banks from the surface of the substrate;
    disposing light emitting layers including an organic light emitting material in the gaps; and
    disposing a common electrode layer including a light transmitting material, the common electrode layer extending continuously above the main column banks, the auxiliary column banks, and the light emitting layers.

* * * * *